(12) United States Patent
Hu

(10) Patent No.: US 12,148,726 B2
(45) Date of Patent: *Nov. 19, 2024

(54) SEMICONDUCTOR SUBSTRATE STRUCTURE, SEMICONDUCTOR STRUCTURE AND MANUFACTURING METHOD THEREOF

(71) Applicant: Dyi-Chung Hu, Hsinchu County (TW)

(72) Inventor: Dyi-Chung Hu, Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/587,993

(22) Filed: Feb. 27, 2024

(65) Prior Publication Data

US 2024/0203921 A1    Jun. 20, 2024

Related U.S. Application Data

(63) Continuation-in-part of application No. 17/979,793, filed on Nov. 3, 2022, now Pat. No. 11,948,899.

(Continued)

(30) Foreign Application Priority Data

Oct. 13, 2022 (TW) .................................. 111138748

(51) Int. Cl.
  *H01L 23/00* (2006.01)
  *H01L 23/498* (2006.01)
  *H01L 25/065* (2023.01)
(52) U.S. Cl.
  CPC ........ *H01L 24/13* (2013.01); *H01L 23/49816* (2013.01); *H01L 23/49822* (2013.01); *H01L 24/05* (2013.01); *H01L 25/0652* (2013.01); *H01L 2224/05024* (2013.01); *H01L 2224/05025* (2013.01); *H01L 2224/13024* (2013.01);

(Continued)

(58) Field of Classification Search
  CPC ..... H01L 24/13; H01L 24/05; H01L 25/0652; H01L 23/49816; H01L 23/49822
  See application file for complete search history.

(56) References Cited

U.S. PATENT DOCUMENTS 9,437,572 B2 * 9/2016 Chen ...................... H01L 21/324
11,948,899 B2 * 4/2024 Hu ........................... H01L 24/81

(Continued)

*Primary Examiner* — Nathan W Ha
(74) *Attorney, Agent, or Firm* — JCIPRNET

(57) ABSTRACT

A semiconductor substrate structure including a first group of circuit structure, a second group of circuit structure, and a first device is provided. The first group of circuit structure includes multiple first wiring layers and multiple first conductive connectors, and each of the first conductive connectors includes a conductive cap. The second group of circuit structure includes multiple second wiring layers and multiple second conductive connectors. The first group of circuit structure and the second group of circuit structure are electrically connected through bonding of the first conductive connectors and the second conductive connectors to form a multilayer redistribution structure. The first device is disposed on the first group of circuit structure and electrically connected to portion of the first conductive connectors or the first device is disposed on the second group of circuit structure and electrically connected to portion of the second conductive connectors. A semiconductor structure and manufacturing method thereof are also provided.

20 Claims, 28 Drawing Sheets

Related U.S. Application Data

(60) Provisional application No. 63/275,914, filed on Nov. 4, 2021.

(52) U.S. Cl.
CPC ............... *H01L 2224/13026* (2013.01); *H01L 2924/01029* (2013.01); *H01L 2924/15311* (2013.01); *H01L 2924/3511* (2013.01)

(56) References Cited

U.S. PATENT DOCUMENTS

| | | | |
|---|---|---|---|
| 2014/0376200 A1* | 12/2014 | Uzoh | H01L 25/0657 |
| | | | 29/832 |
| 2015/0171050 A1* | 6/2015 | Chen | H01L 27/1464 |
| | | | 257/784 |
| 2016/0329290 A1* | 11/2016 | Haba | H01L 24/92 |
| 2018/0342476 A1* | 11/2018 | Wirz | H01L 24/16 |
| 2019/0067228 A1* | 2/2019 | Son | H01L 24/81 |
| 2021/0005565 A1* | 1/2021 | Son | H01L 24/92 |
| 2021/0193606 A1* | 6/2021 | Wirz | H01L 24/81 |
| 2021/0202396 A1* | 7/2021 | Wu | H01L 25/0652 |
| 2022/0037201 A1* | 2/2022 | Chen | H01L 23/16 |
| 2022/0068862 A1* | 3/2022 | Wu | H01L 23/49816 |
| 2022/0359427 A1* | 11/2022 | Wu | H01L 23/562 |
| 2022/0406739 A1* | 12/2022 | Tamura | H01L 24/02 |

\* cited by examiner

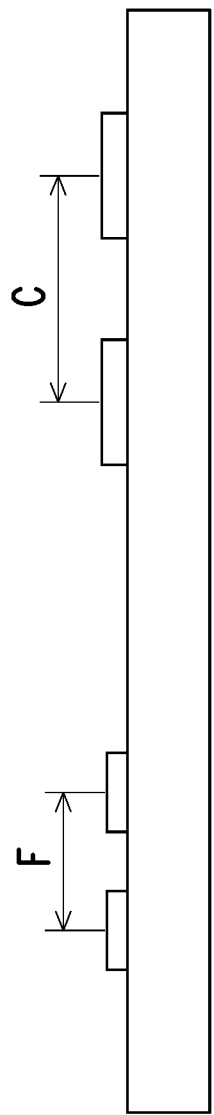
FIG. 5A
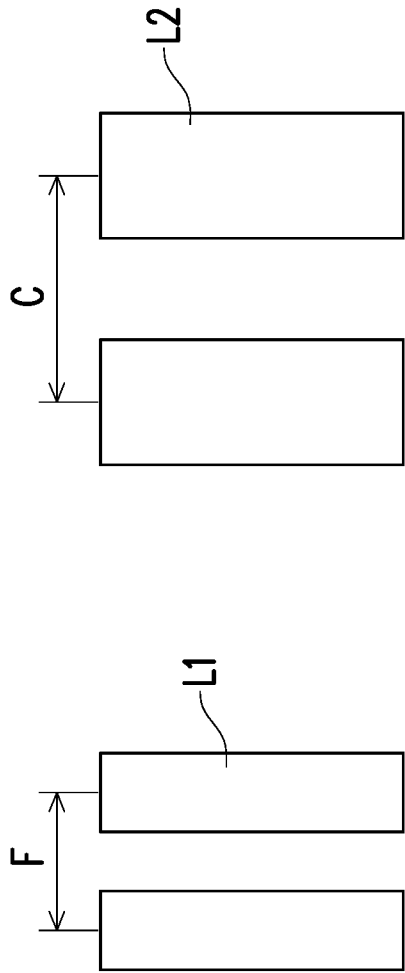
FIG. 5B
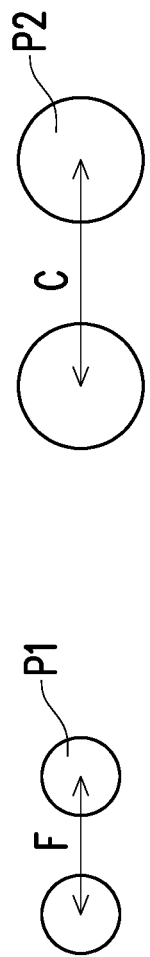

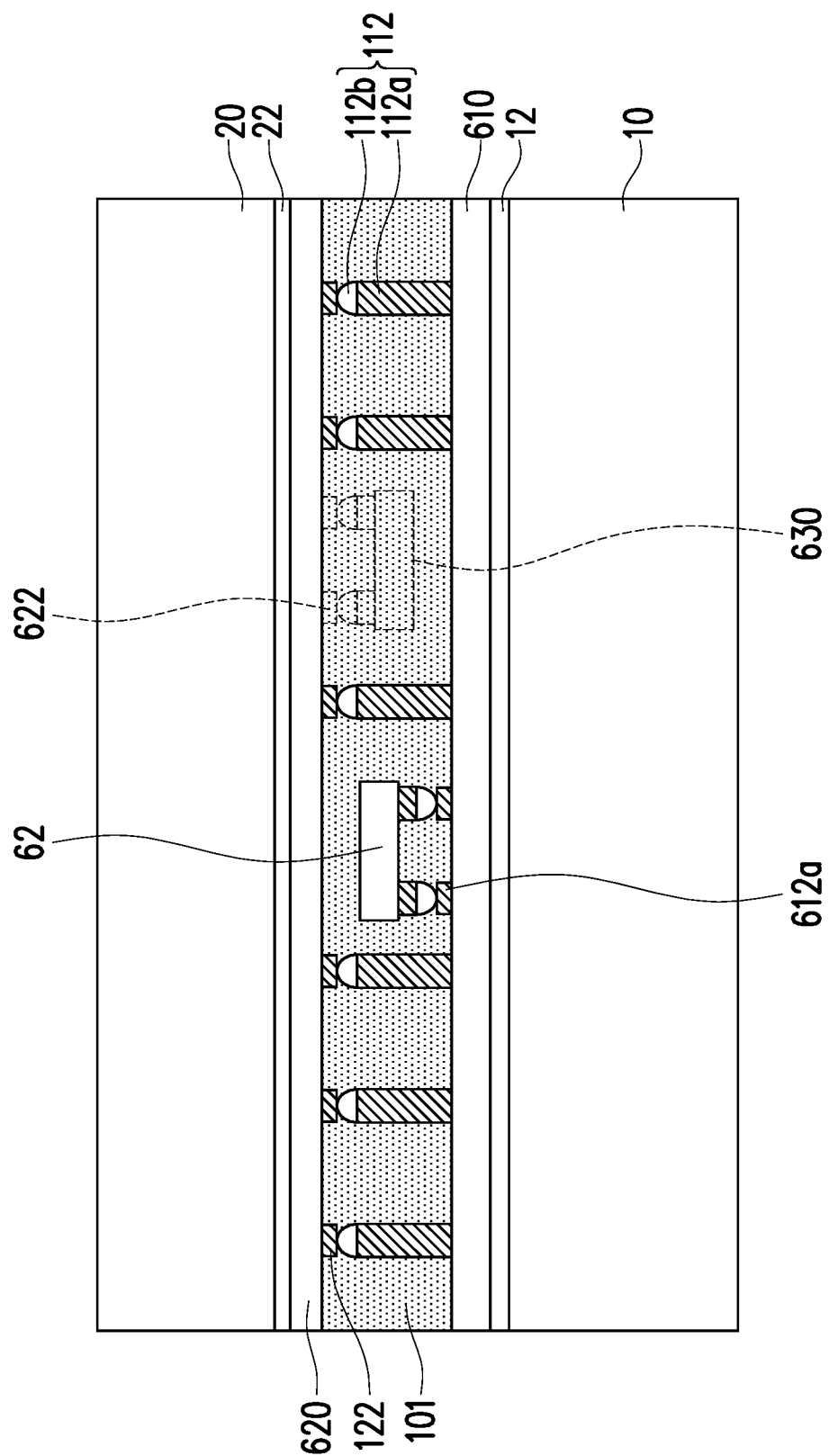

SEMICONDUCTOR SUBSTRATE STRUCTURE, SEMICONDUCTOR STRUCTURE AND MANUFACTURING METHOD THEREOF

CROSS-REFERENCE TO RELATED APPLICATION

This application is a continuation-in-part application of and claims the priority benefit of a prior application Ser. No. 17/979,793, filed on Nov. 3, 2022. The prior application Ser. No. 17/979,793 claims the priority benefits of U.S. provisional application Ser. No. 63/275,914, filed on Nov. 4, 2021 and Taiwan application serial no. 111138748, filed on Oct. 13, 2022. The entirety of each of the above-mentioned patent applications is hereby incorporated by reference herein and made a part of this specification.

BACKGROUND

Technical Field

The invention relates to a semiconductor substrate structure, semiconductor structure and a manufacturing method thereof.

Description of Related Art

In integrated circuit applications, a redistribution layer (RDL) is a multilayer structure formed of conductive materials and dielectric materials, and the RDL layer is often fabricated on a temporary carrier board. However, a material used in the aforementioned multilayer structure and a material used in the temporary carrier board may have a mismatch in coefficient of thermal expansion (CTE). Therefore, it is easy to cause warpage in a process of continuously forming the aforementioned multilayer structure (at least four layers are continuously formed) on the temporary carrier board, and the warpage will be more obvious when the number of the layers increases. As a result, a yield and electrical performance of the semiconductor substrate structure are adversely affected.

SUMMARY

The invention is directed to a semiconductor substrate structure and a manufacturing method thereof, which are adapted to maintain a better yield and electrical performance while having a multilayer redistribution structure.

The invention provides a semiconductor substrate structure including a first group of circuit structure, a second group of circuit structure, and a first device. The first group of circuit structure includes multiple first wiring layers and multiple first conductive connectors, and each of the first conductive connectors includes a conductive cap. The second group of circuit structure includes multiple second wiring layers and multiple second conductive connectors. The first group of circuit structure and the second group of circuit structure are electrically connected through bonding of the first conductive connectors and the second conductive connectors to form a multilayer redistribution structure. The first device is disposed on the first group of circuit structure and electrically connected to portion of the first conductive connectors or the first device is disposed on the second group of circuit structure and electrically connected to portion of the second conductive connectors.

The invention provides a semiconductor structure including the semiconductor substrate structure from above and at least one chip disposed on the multilayer redistribution structure.

The invention provides a manufacturing method of a semiconductor structure including at least following steps. A first group of circuit structure is formed on a first temporary carrier board. The first group of circuit structure includes multiple first wiring layers and multiple first conductive connectors, and each of the first conductive connectors includes a conductive cap. A second group of circuit structure is formed on a second temporary carrier board. The second group of circuit structure includes multiple second wiring layers and multiple second conductive connectors. A first device is disposed between two adjacent first conductive connectors or two adjacent second conductive connectors. The first conductive connectors of the first group of circuit structure are bonded to the second conductive connectors of the second group of circuit structure to form electrical connection and form a multilayer redistribution structure.

Based on the above, in the invention, multiple groups of circuit structures are separately fabricated on the temporary carrier boards, and then the multiple groups of circuit structures are directly assembled into a multilayer redistribution structure. In this way, compared with the multilayer redistribution structure fabricated continuously at one time, a degree of warpage may be effectively reduced, so that the semiconductor substrate structure may maintain better yield and electrical performance while having the multilayer redistribution structure.

In order for the aforementioned features and advantages of the disclosure to be more comprehensible, several embodiments accompanied with drawings are described in detail as follows.

BRIEF DESCRIPTION OF THE DRAWINGS

FIG. 5A is a partial schematic cross-sectional view of a spacing of a circuit structure.

FIG. 5B is a partial schematic top view corresponding to FIG. 5A.

FIG. 6A to FIG. 6G are partial schematic cross-sectional views of a manufacturing method of a semiconductor structure according to some embodiments of the invention.

DESCRIPTION OF THE EMBODIMENTS

Figure 1A:
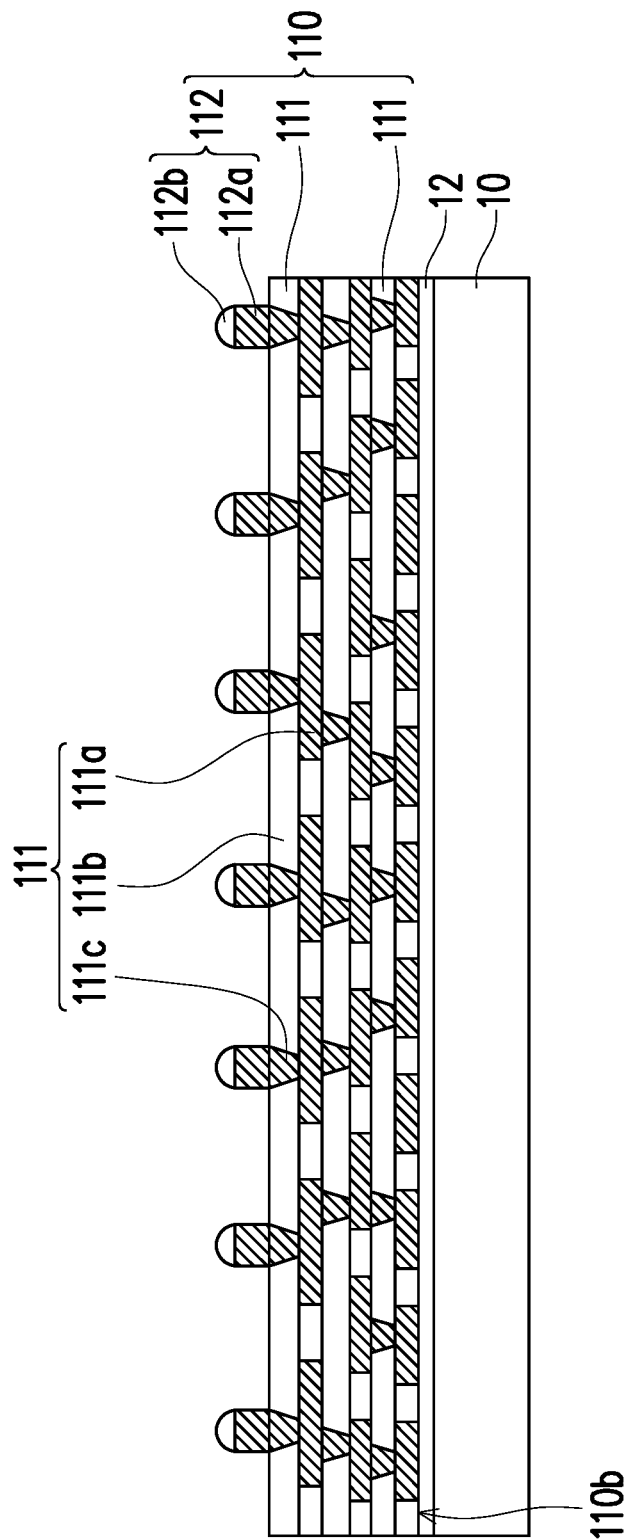
FIG. 1A to FIG. 1C are partial schematic cross-sectional views of a manufacturing method of a semiconductor substrate structure according to some embodiments of the invention.

Illustrative embodiments of the invention will be fully described below with reference to the drawings, but the invention may also be embodied in many different forms and should not be construed as being limited to the embodiments described herein. In the drawings, for clarity's sake, the size and thickness of various regions, parts and layers may not be drawn to scale. In order to facilitate understanding, the same elements in the following description will be denoted by the same reference numerals.

The invention is more fully described with reference to the drawings of the embodiment. However, the invention may also be embodied in various forms and should not be limited to the embodiments described herein. The thicknesses, sizes or magnitudes of layers or regions in the drawings may be exaggerated for clarity's sake. The same or similar reference numerals denote the same or similar elements, and the repeated descriptions will not be repeated in the following paragraphs.

Directional terms (for example, up, down, right, left, front, back, top, bottom) as used herein are used for reference only to the drawings and are not intended to imply absolute orientations.

It should be noted that although the terms "first", "second", "third", etc. may be used for describing various elements, components, regions, layers and/or portions, but the elements, components, regions, layers and/or portions are not limited by these terms. These terms are only used for separating one element, component, region, layer or portion from another element, component, region, layer or portion.

Unless otherwise defined, all terms (including technical and scientific terms) used herein have the same meaning as commonly understood by one of ordinary skill in the art to which this invention belongs.

Figure 1B:
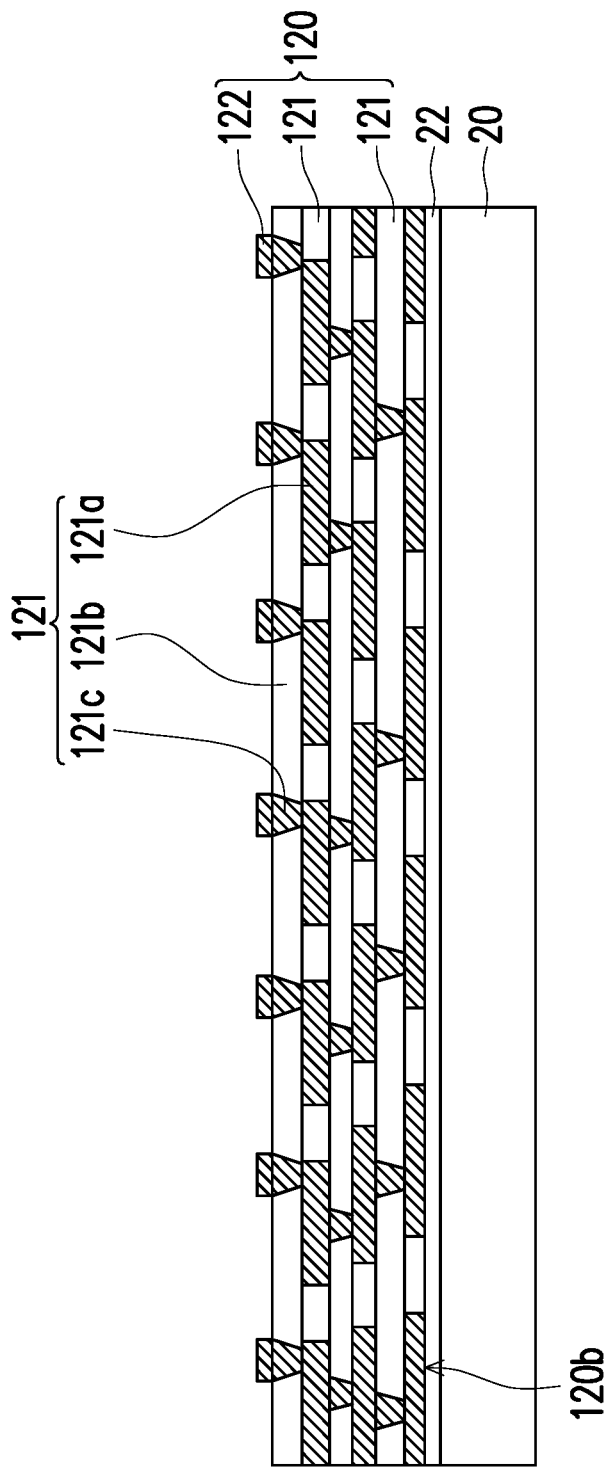
Figure 1C:
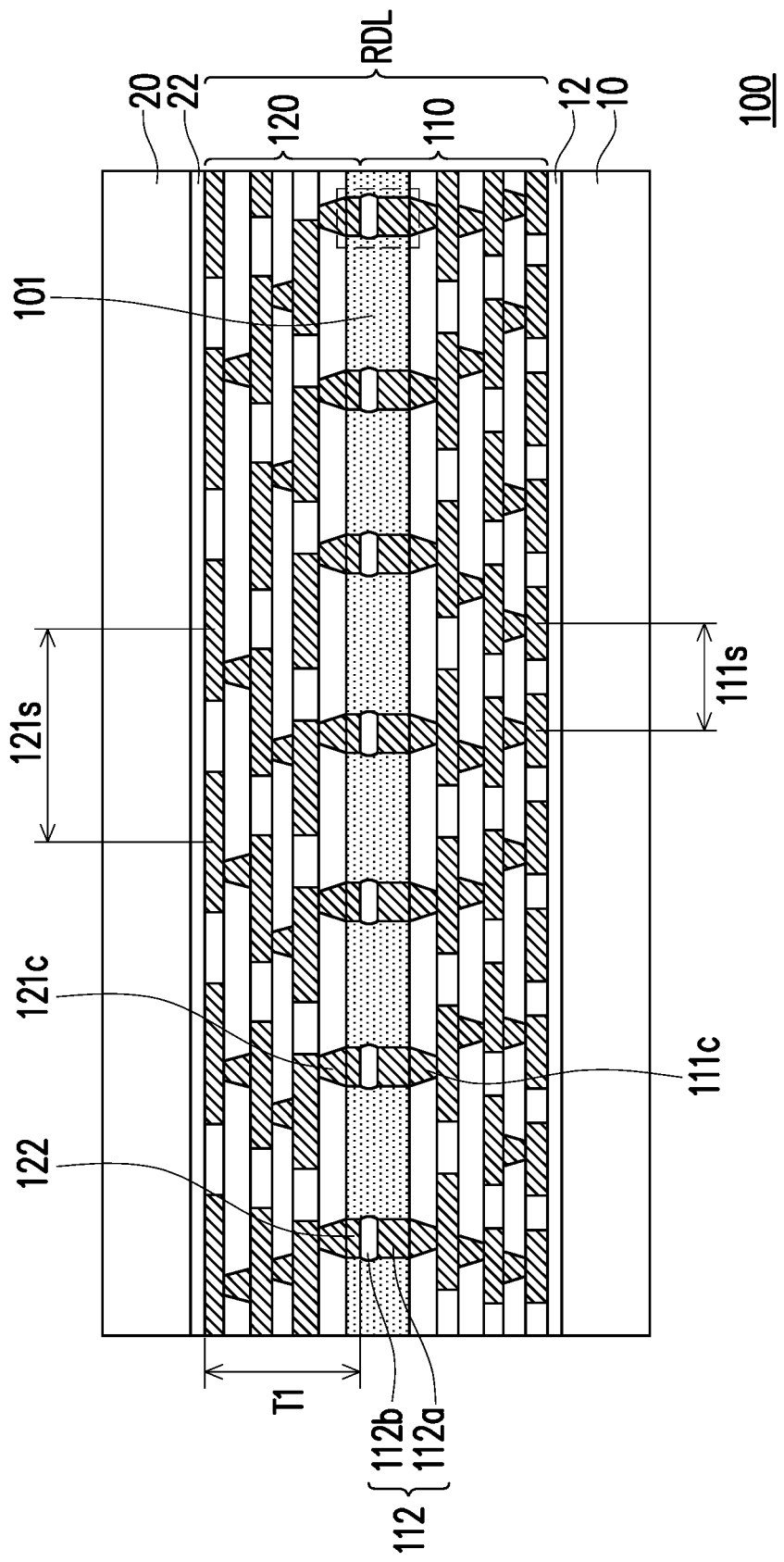
Figure 1D:
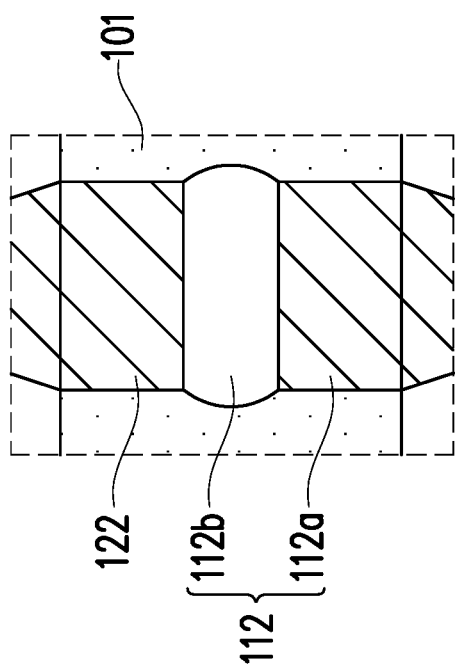
FIG. 1D is a schematic view of bonding of conductive connectors of other alternative embodiments of FIG. 1C.
Figure 1E:
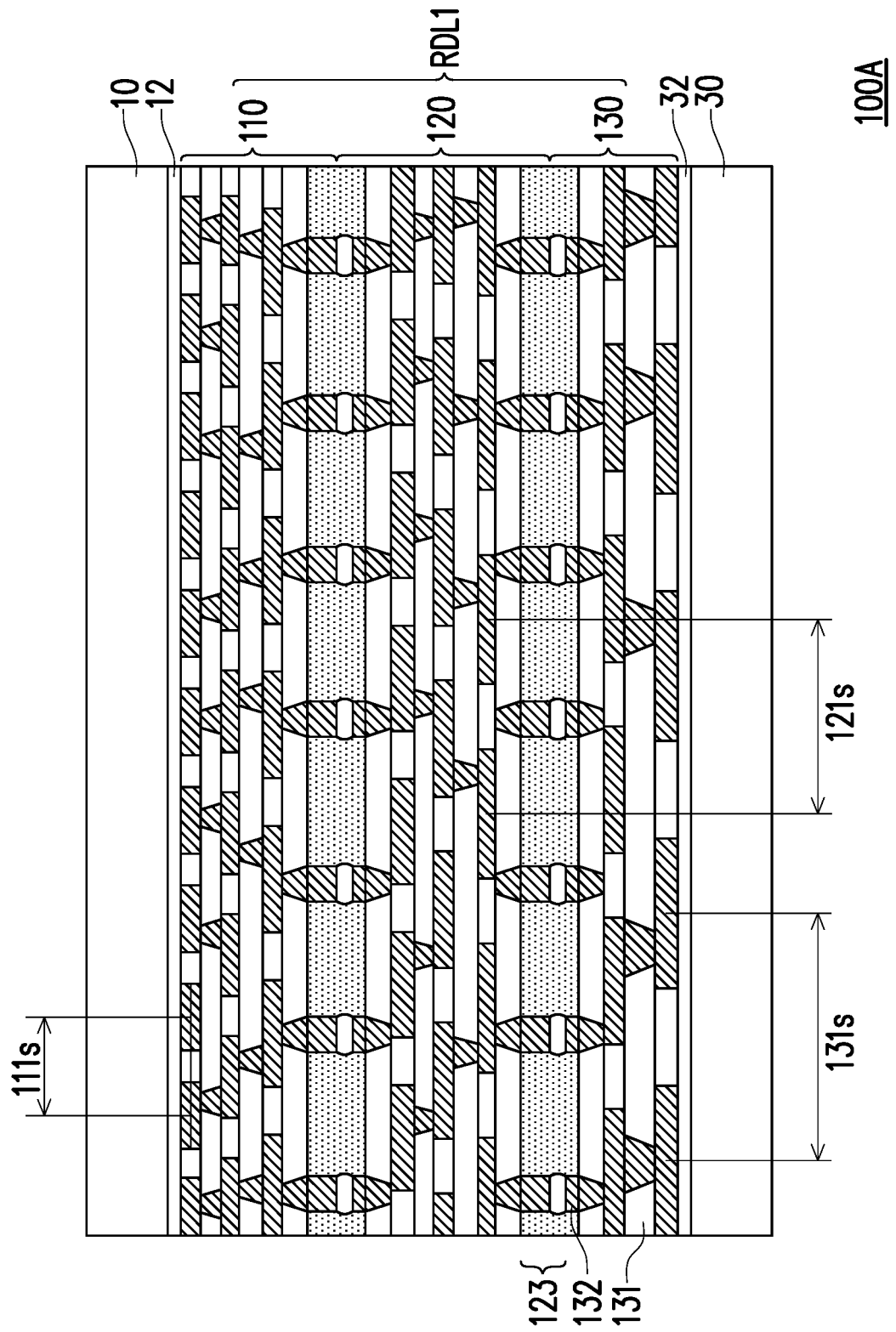
FIG. 1E and FIG. 1F are partial schematic cross-sectional views of semiconductor substrate structures according to other embodiments of the invention.
Figure 1F:
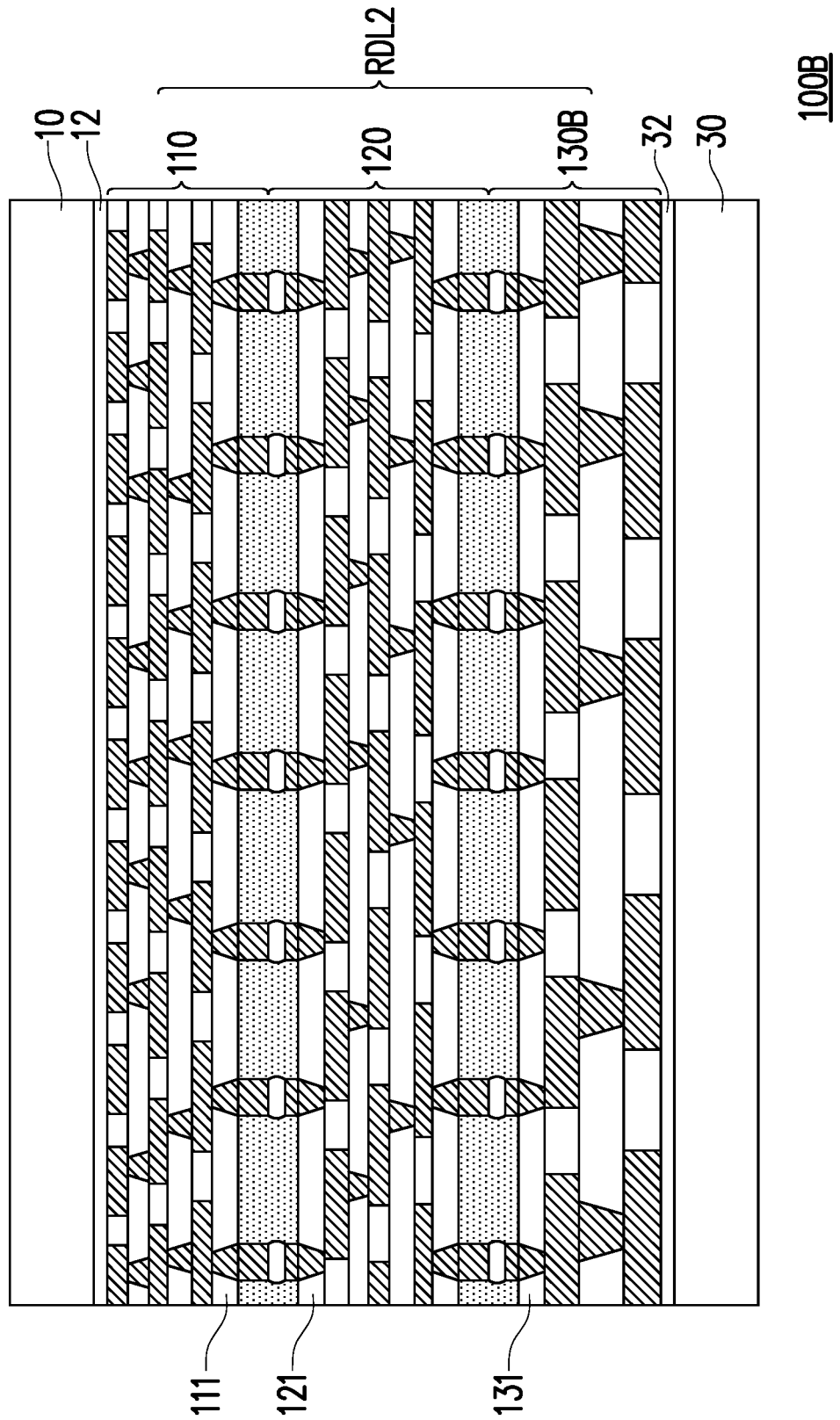

FIG. 1A to FIG. 1C are partial schematic cross-sectional views of a manufacturing method of a semiconductor substrate structure according to some embodiments of the invention. FIG. 1D is a schematic view of bonding of conductive connectors of other alternative embodiments of FIG. 1C. FIG. 1E and FIG. 1F are partial schematic cross-sectional views of semiconductor substrate structures according to other embodiments of the invention. Referring to FIG. 1A, a first group of circuit structure 110 is formed on a first temporary carrier board 10. The first temporary carrier 10 may be made of glass, plastic, silicon, metal or other suitable materials, as long as the material may withstand subsequent processes and at the same time carry the structures formed thereon. In here, the first group of circuit structure 110 may be a thin-film RDL.

In some embodiments, a first release layer 12 (for example, a photothermal conversion film or other suitable release layer) may be optionally coated between the first temporary carrier board 10 and the first group of circuit structure 110 to enhance strippability between the first temporary carrier board 10 and the first group of circuit structure 110 in a subsequent process and improve a flatness of the first group of circuit structure 110, but the invention is not limited thereto.

In the present embodiment, the first group of circuit structure 110 includes multiple first wiring layers 111 (three wiring layers are schematically shown in FIG. 1A) and multiple first conductive connectors 112 may be formed on the first temporary carrier board 10. Each first wiring layer 111 may include a first conductive pattern 111a, a first dielectric layer 111b and/or first conductive vias 111c, and each first conductive connector 112 may include a conductive pillar 112a and a conductive cap 112b. The first conductive pattern 111a and the first conductive vias 111c may be embedded in the first dielectric layer 111b, and the conductive cap 112b may be located on the conductive pillar 112a, but the invention is not limited thereto. In an unillustrated embodiment, the conductive pillar 112a may be omitted, i.e., the conductive cap 112b may be directly formed on the first wiring layer 111 to directly serve as the first conductive connector 112.

In some embodiments, the first conductive pattern 111a may be formed on the first temporary carrier board 10 by using a deposition process, a lithography process, an etching process, or other suitable processes. Then, the first dielectric layer 111b including multiple openings may be formed on the first temporary carrier board 10 by using, for example, a coating process, a lithography etching process, or other suitable processes. The openings expose at least a part of the first conductive patterns 111a for electrical connection. Then, a conductive material may be formed in the openings of the first dielectric layer 111b to form the first conductive vias 111c by using a suitable deposition process. Then, the above steps are performed by multiple times to form a multilayer first wiring layer 111. It should be noted that the first group of circuit structure 110 shown in FIG. 1A is only exemplary, and the first group of circuit structure 110 with more or less layers may be formed according to actual circuit design requirements, and it is considered to be within a protection scope of the invention as long as the first group of circuit structure 110 includes at least two layers of the first wiring layer 111 and the conductive connectors 112.

In some embodiments, a material of the first conductive pattern 111a and the first conductive vias 111c may include copper, gold, nickel, aluminum, platinum, tin, combinations thereof, alloys thereof, or other suitable conductive materials, and a material of the first dielectric layer 111b may include polyimide (PI), benzocyclobutene (BCB), polybenzoxazole (PBO), inorganic dielectric materials (such as silicon oxide, silicon nitride, etc.) or other suitable electrical insulating materials, but the invention is not limited thereto.

In some embodiments, a material of the conductive pillar 112a may include copper, and a material of the conductive cap 112b may include solder, but the invention is not limited thereto, and the conductive pillar 112a and the conductive cap 112b may be made of other suitable conductive materials.

In the embodiment, the first group of circuit structure 110 includes a bottom surface 110b near the first temporary carrier board 10. The first conductive pattern 111a and the first dielectric layer 111b at the bottom surface 110b may be substantially flush. In addition, the first conductive vias 111c are gradually widened (for example, a width or diameter thereof is gradually increased) toward a direction of the first conductive connectors 112. In other words, the first conductive vias 111c are gradually tapered (for example, the width or diameter thereof is gradually decreased) toward a direction of the first temporary carrier board 10, but the invention is not limited thereto.

In some embodiments, a distribution density of the first conductive patterns 111a on the bottom surface 110b of the first group of circuit structure 110 must be sufficient for subsequent mounting of semiconductor chips, but the invention is not limited thereto.

In some embodiments, a planarization process (for example, a grinding process, a fly cutting process, a chemical mechanical polishing (CMP) process, or a combination thereof) may be performed on a top surface of the conductive cap 112b on the conductive pillar 112a to ensure flatness of the top of the first conductive connector 112, but the invention is not limited thereto.

Referring to FIG. 1B, a second group of circuit structure 120 is formed on a second temporary carrier board 20. The second group of circuit structure 120 includes multiple second wiring layers 121 (three wiring layers are schematically shown in FIG. 1B) and multiple second conductive connectors 122, and each of the second wiring layers 121 may include a second conductive pattern 121a, a second dielectric layer 121b and/or second conductive vias 121c. The second conductive pattern 121a and the second conductive vias 121c may be embedded in the second dielectric layer 121b, but the invention is not limited thereto.

In the embodiment, the second group of circuit structure 120 includes a bottom surface 120b near the second temporary carrier board 20. The second conductive pattern 121a and the second dielectric layer 121b at the bottom surface 120b may be substantially flush. In addition, the second conductive vias 121c are gradually widened (for example, a width or diameter thereof is gradually increased) toward a direction of the second conductive connectors 122. In other words, the second conductive vias 121c are gradually tapered (for example, the width or diameter thereof is gradually decreased) toward a direction of the second temporary carrier board 20, but the invention is not limited thereto.

In some embodiments, the second conductive connector 122 may be in a pad form, a conductive pillar form or other suitable forms, which is not limited by the invention. In addition, in an unillustrated embodiment, the second conductive connectors 122 may be formed by sequentially stacking a first seed layer, a second seed layer (a material thereof is, for example, titanium/copper (Ti/Cu)) and a plating layer (a material thereof is, for example, copper), but the invention is not limited thereto. In other embodiments, the second conductive connectors 122 may include other suitable conductive materials such as silver, gold, nickel or alloys thereof, for example, Cu, Cu/Ni/Au, Cu/Ti, Cu/Ag or equivalents thereof. For example, an adhesive layer (a material thereof is, for example, titanium) may be formed on the conductive pad (a material thereof is, for example, copper), and then a metal layer (a material thereof is, for example, silver) is formed on the adhesive layer by electroplating, sputtering or other suitable deposition methods. A thickness of the adhesive layer may be smaller than a thickness of the metal layer, but the invention is not limited thereto. A form of the second conductive connector 122 may be selected according to actual design requirements.

In some embodiments, the second conductive patterns 121a of the bottom surface 120b of the second group of circuit structure 120 may be used for subsequent mounting of a substrate or an external terminal, but the invention is not limited thereto.

It should be noted that, other specific details of forming the second group of circuit structure 120 (such as materials, forming methods, and setting of the second release layer 22) are similar to those of forming the first group of circuit structure 110, and details thereof are not repeated.

Referring to FIG. 1C, the structure shown in FIG. 1B is flipped upside down to directly bond the first group of circuit structure 110 and the second group of circuit structure 120, so that the first conductive connectors 112 are bonded to the second conductive connectors 122 to form a multilayer redistribution structure RDL. In addition, a base adhesive 101 (also may be an underfill 101) may be optionally disposed between the first group of circuit structure 110 and the second group of circuit structure 120, and the base adhesive 101 may be filled into a gap between the first conductive connectors 112 and the second conductive connectors 122, so that the base adhesive 101 may surround the first conductive connectors 112 and the second conductive connectors 122 to further improve bonding reliability, but the invention is not limited thereto. The semiconductor substrate structure 100 of the embodiment is substantially completed through the above fabrication.

In the embodiment, the semiconductor substrate structure 100 includes the first group of circuit structure 110 and the second group of circuit structure 120. The first group of circuit structure 110 includes the first wiring layers 111 and the first conductive connectors 112. The second group of circuit structure 120 includes the second wiring layers 121 and the second conductive connectors 122. The first group of circuit structure 110 and the second group of circuit structure 120 are electrically connected through the bonding of the first conductive connectors 112 and the second conductive connectors 122 to form the multilayer redistribution structure RDL. In this way, in the embodiment, multiple groups of circuit structure (the first group of circuit structure 110 and the second group of circuit structure 120) are fabricated on temporary carrier boards (the first temporary carrier board 10 and the second temporary carrier board 20) separately, and then the multiple groups of circuit structure are directly assembled into a multilayer redistribution structure (the multilayer redistribution structure RDL). In this way, compared with the one-time continuous fabrication of the multilayer redistribution structure, the degree of warpage may be effectively reduced, so that the semiconductor substrate structure 100 may maintain better yield and electrical performance while having the multilayer redistribution structure RDL.

Further, due to the limitations of the manufacturing process, the difficulty is positively related to the number of layers to be fabricated. Therefore, when more layers are to be fabricated, the probability that the entire redistribution structure is damaged during the fabrication process is higher, so that it is impossible to effectively control the yield and cost. In the embodiment, the multilayer redistribution structure RDL is divided into multiple groups of circuit structure with a smaller number of layers, which are separately fabricated, thereby avoiding the problem of unable to effectively control the yield and cost due to the continuous stacking of multiple layers, but the invention is not limited thereto.

In some embodiments, since the first group of circuit structure 110 and the second group of circuit structure 120 have a bonding interface formed by the conductive cap 112b including solder, the connection of the multilayer redistribution structure RDL may be regarded as a solder-containing connection, but the invention is not limited thereto.

In some embodiments, the first group of circuit structure 110 and the second group of circuit structure 120 may be aligned and bonded to each other, so that the first conductive connectors 112 and the second conductive connectors 122 may be correspondingly bonded in a one-to-one manner, but the invention is not limited thereto.

In some embodiments, a height of the conductive pillar 112a of the first conductive connector 112 may be greater than a height of the second conductive connector 122, but the invention is not limited thereto. In other alternative embodiments, as shown in FIG. 1D, the height of the conductive pillar 112a of the first conductive connector 112 may be substantially equal to the height of the second conductive connector 122, i.e., the height of the conductive pillar 112a of the first conductive connector 112 and the height of the second conductive connector 122 may be adjusted according to actual design requirements, which are not limited in the invention.

In some embodiments, a reflow process may be performed on the conductive cap 112b of the first conductive connector 112 to electrically couple the second conductive connector 122 to the conductive pillar 112a, but the invention is not limited thereto.

In some embodiments, the finer a line spacing/pitch (L/S) (for example, a line width) of the circuit is, the more stringent the requirements of the manufacturing process are, so that more difficulties may be encountered in forming the multilayer redistribution structure, and compared with the continuously formed structure, the fine line spacing/pitch structure fabricated by using the method of bonding and assembling multiple groups of circuit structures in the embodiment may have greater advantages in yield and electrical performance. For example, both of the first group of circuit structure 110 and the second group of circuit structure 120 may have a fine line spacing/pitch of at least less than 7 microns, so that the first group of circuit structure 110 and the second group of circuit structure 120 may be assembled into the multilayer redistribution structure RDL with a fine line spacing/pitch, but the invention is not limited thereto.

In some embodiments, as shown in FIG. 1C, each first wiring layer 111 includes two adjacent first lines, and there is a first spacing 111s between center points of the two adjacent first lines. Each second wiring layer 121 includes two adjacent second lines, and there is a second spacing 121s between center points of the two adjacent second lines. The first spacing 111s of each of the first wiring layers 111 is smaller than the second spacing 121s of each of the second wiring layers 121, and the spacing of each layer gradually increases from the first group of circuit structure 110 toward the second group of circuit structure 120. In the embodiment, the first spacing 111s and the second spacing 121s are the minimum spacings of the layers, but the invention is not limited thereto. In other embodiments, the first spacing 111s and the second spacing 121s may be average spacings of the layers.

FIG. 5A is a partial schematic cross-sectional view of a spacing of a circuit structure. FIG. 5B is a partial schematic top view corresponding to FIG. 5A. Further, as shown in FIG. 5A and FIG. 5B, the wiring layer may have a fine spacing F and a coarse spacing C, and the spacing may be, for example, a distance between the center points of two adjacent lines, for example, a distance between center points of two adjacent lines L1 is the fine spacing F, and a distance between center points of two adjacent lines L2 is the coarse spacing C; or the spacing may be, for example, a distance between two adjacent pad, for example, a distance between center points of two adjacent pads P1 is the fine spacing F, and a distance between center points of two adjacent pads P2 is the coarse spacing C. Therefore, the aforementioned first spacing 111s and second spacing 121s may adopt the above designs according to actual design requirements, which is not limited by the invention.

In some embodiments, the first conductive vias 111c are gradually widened (for example, a width or diameter thereof is gradually increased) toward a direction of the first conductive connectors 112, and the second conductive vias 121c are gradually widened (for example, a width or diameter thereof is gradually increased) toward a direction of the second conductive connectors 122. In other words, the first conductive vias 111c are gradually tapered (for example, the width or diameter thereof is gradually decreased) toward a direction of the first temporary carrier board 10, and the second conductive vias 121c are gradually tapered (for example, the width or diameter thereof is gradually decreased) toward a direction of the second temporary carrier board 20. Namely, after the bonding process, a gradual tapering direction of the first conductive vias 111c is opposite to a gradual tapering direction of the second conductive vias 121c.

It should be noted that according to practical requirements, the first temporary carrier board 10 and/or the second temporary carrier board 20 may be optionally removed to expose the first conductive pattern 111a and/or the second conductive pattern 121a to implement electrical connection with other components. In the embodiment, the release layer may be peeled off by applying external energy between the bottom surface of the circuit structure and the temporary carrier board.

In some embodiments, the number of groups of circuit structures may not be limited to two. For example, a multilayer redistribution structure RDL1 of a semiconductor substrate structure 100A shown in FIG. 1E may further include a third group of circuit structure 130. The third group of circuit structure 130 includes multiple third wiring layers 131 and multiple third conductive connectors 132. Further, the second group of circuit structure 120 is disposed between the first group of circuit structure 110 and the third group of circuit structure 130 and is electrically connected thereto. The second group of circuit structure 120 has another conductive connector 123 relative to the first group of circuit structure 110, and the another conductive connector is bonded to the third conductive connector 132, but the invention is not limited thereto. In addition, another base adhesive 102 may also be arranged between the second group of circuit structure 120 and the third group of circuit structure 130, and the base adhesive 102 may be filled into the gap between the fourth conductive connectors 123 and the third conductive connectors 132, so that the base adhesive 102 may surround the fourth conductive connectors 123 and the third conductive connectors 132 to further improve bonding reliability, but the invention is not limited thereto.

In some embodiments, the semiconductor substrate structure 100A is completed by, for example, the following steps. The semiconductor substrate structure 100A may be continued from FIG. 1C. The second temporary carrier board 20 is removed, and the fourth conductive connectors 123 are formed on the second group of circuit structure 120, and the third group of circuit structure 130 is formed on a third temporary carrier board 30 formed with a third release layer 32. Then, the fourth conductive connectors 123 and the third conductive connectors 132 are bonded to form the multilayer redistribution structure RDL1, but the invention is not limited thereto.

In some embodiments, the number of the first wiring layers 111 (six-layer structure) of the first group of circuit structure 110 is the same as the number of the second wiring layers 121 (six-layer structure) of the second group of circuit structure 120, as shown in FIG. 1C, but different implementations are also applicable. For example, in the semiconductor substrate structure 100A shown in FIG. 1E, the number of the first wiring layers 111 (six-layer structure) of the first group of circuit structure 110 is different from that (four-layer structure) of the third group of circuit structure 130, and the number difference may be one or two.

In some embodiments, each third wiring layer includes two adjacent third lines, and there is a third spacing 131s between center points of the two adjacent third lines. The second spacing 121s of each second wiring layer 121 is smaller than the third spacing 131s of each third wiring layer 131, and the spacing of each layer gradually increases from the first group of circuit structure 110 toward the third group of circuit structure 120.

In some embodiments, a thickness of the first wiring layer 111 (six-layer structure) of the first group of circuit structure 110 is the same as a thickness of the second wiring layer 121 (six-layer structure) of the second group of circuit structure 120, but different implementations are also applicable. For example, in a semiconductor substrate structure 100B shown in FIG. 1F, the thickness of the first wiring layer 111 of the first group of circuit structure 110 and the thickness of the second wiring layer 121 of the second group of circuit structure 120 are different from the thickness of the third wiring layer 130 of the third group of circuit structure 130, so as to form a multilayer redistribution structure RDL2, but the invention is not limited thereto.

It should be noticed that reference numbers of the components and a part of contents of the aforementioned embodiment are also used in the following embodiment, where the same reference numerals denote the same or like components, and descriptions of the same technical contents are omitted. The aforementioned embodiment may be referred for descriptions of the omitted parts, and detailed descriptions thereof are not repeated in the following embodiment.

Figure 2:
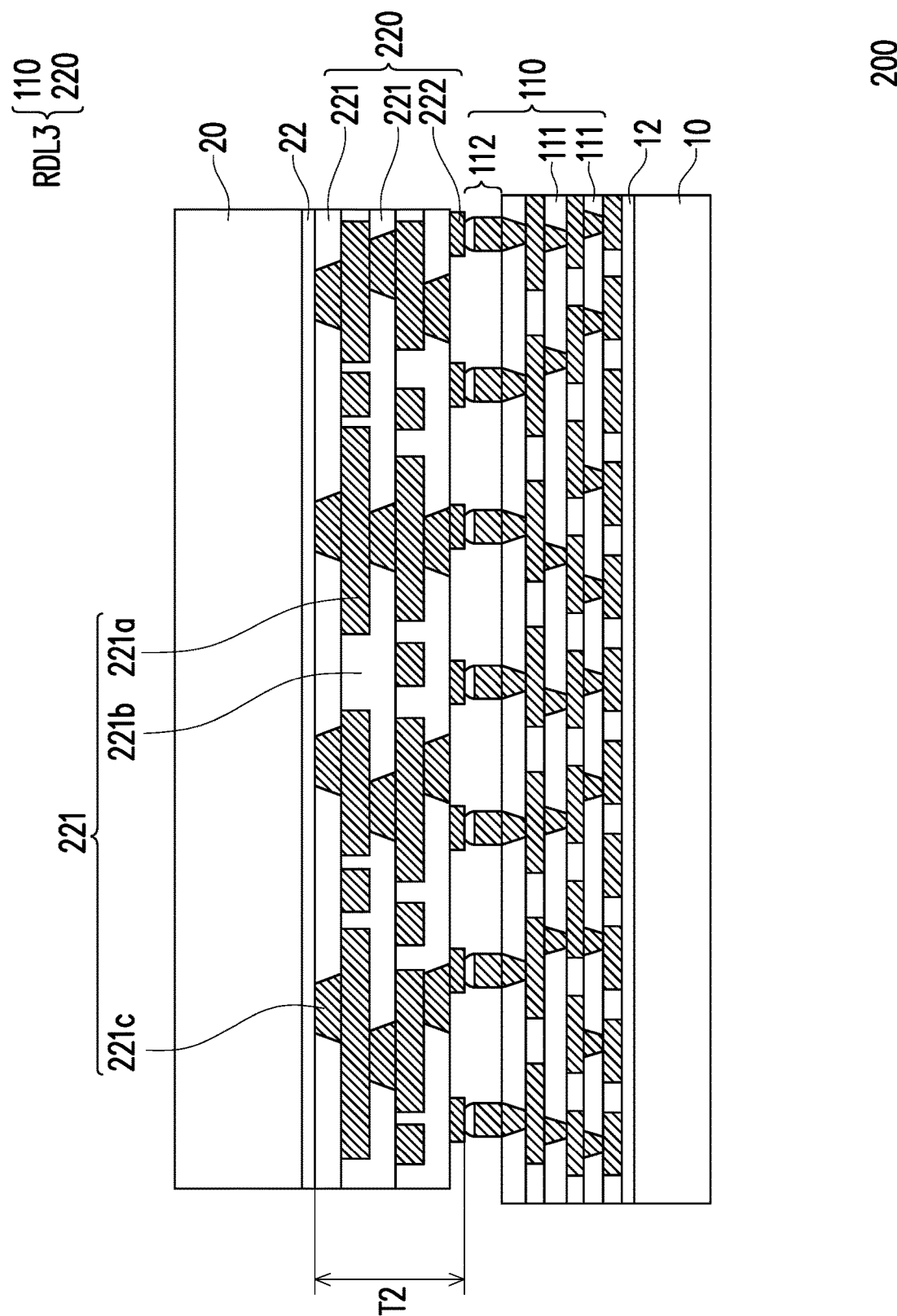
FIG. 2 is a partial schematic cross-sectional view of a semiconductor substrate structure according to further embodiments of the invention.

FIG. 2 is a partial schematic cross-sectional view of a semiconductor substrate structure according to further embodiments of the invention. Referring to FIG. 2, a difference between a semiconductor substrate structure 200 of the embodiment and the semiconductor substrate structure 100 of FIG. 1C is that a second group of circuit structure 220 has a coarse line spacing/pitch at least greater than 7 μm. Namely, in the embodiment, a multilayer redistribution structure RDL3 may be a combination of a coarse line spacing/pitch circuit structure and a fine line spacing/pitch circuit structure to achieve more application flexibility. In addition, in the embodiment, the base adhesive 101 may be omitted, but the base adhesive 101 may also be further configured.

Furthermore, the second group of circuit structure 220 includes multiple second wiring layers 221 (three wiring layers are schematically shown in FIG. 2) and multiple second conductive connectors 222, and each second wiring layer 221 may include a second conductive pattern 221a, a second dielectric layer 221b and/or second conductive vias 221c. In the embodiment, the second conductive pattern 221a and the second conductive vias 221c may be embedded in the second dielectric layer 221b, and details thereof are not repeated.

In the embodiment, a density of the second conductive pattern 221a of the second wiring layer 221 close to the second conductive connectors 222 may be denser than a density of the second conductive pattern 221a of the second wiring layer 221 away from the second conductive connectors 222. Namely, the density of the conductive patterns in the second group of circuit structure 220 may present a sparse to dense circuit distribution in a direction from the second temporary carrier board 20 to the second conductive connectors 222, but the invention is not limited thereto.

In the embodiment, a material and formation method of the second conductive pattern 221a and/or the second conductive vias 221c are similar to those of the second conductive pattern 121a and/or the second conductive vias 121, but a material of the second dielectric layer 221b is different from that of the second dielectric layer 121b. For example, the material of the second dielectric layer 221b may be an Ajinomoto build-up film (ABF), polypropylene (PP), etc., and the second dielectric layer 221b may be formed by a suitable deposition process.

In some embodiments, a total thickness T2 of the second group of circuit structure 220 may be greater than a total thickness T1 of the second group of circuit structure 120 in FIG. 1C, so that the multilayer redistribution structure RDL3 may be a thick film RDL, but the invention is not limited thereto.

Figure 3A:
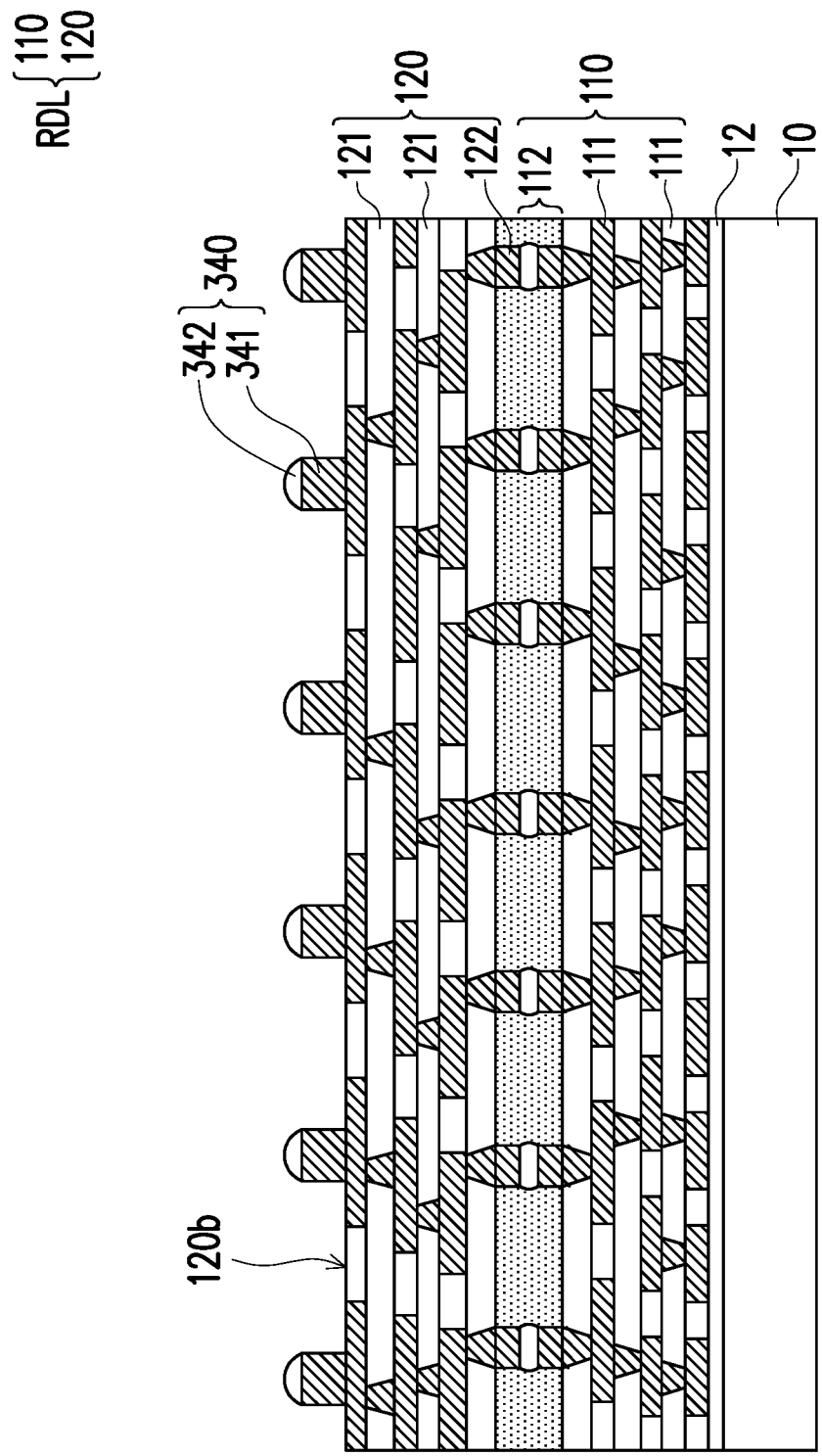
FIG. 3A to FIG. 3E are partial schematic cross-sectional views of a manufacturing method of a semiconductor structure according to further embodiments of the invention.

FIG. 3A to FIG. 3E are partial schematic cross-sectional views of a manufacturing method of a semiconductor structure according to further embodiments of the invention. Referring to FIG. 3A, 1C, the second temporary carrier board 20 and the second release layer 22 are removed to expose the second conductive pattern 121a and the second dielectric layer 121b (which may be regarded as a terminal end of the multilayer redistribution structure RDL) on the bottom surface 120b of the second group of circuit structure 120. In the embodiment, a height of the conductive pillar 112a of the first conductive connector 112 as shown in FIG. 1D may be selected to be substantially equal to the height of the second conductive connector 122.

Then, multiple fifth conductive connectors 340 may be formed on the second conductive pattern 121a on the bottom surface 120b of the second group of circuit structure 120. Each of the fifth conductive connectors 340 includes a conductive pillar 341 and conductive cap 342 formed thereon. In the embodiment, the conductive pillar 341 may be made of copper, and the conductive cap 342 may be made of solder, but the invention is not limited thereto, and the conductive pillar 341 and the conductive cap 342 may also be made of other suitable materials.

Figure 3B:
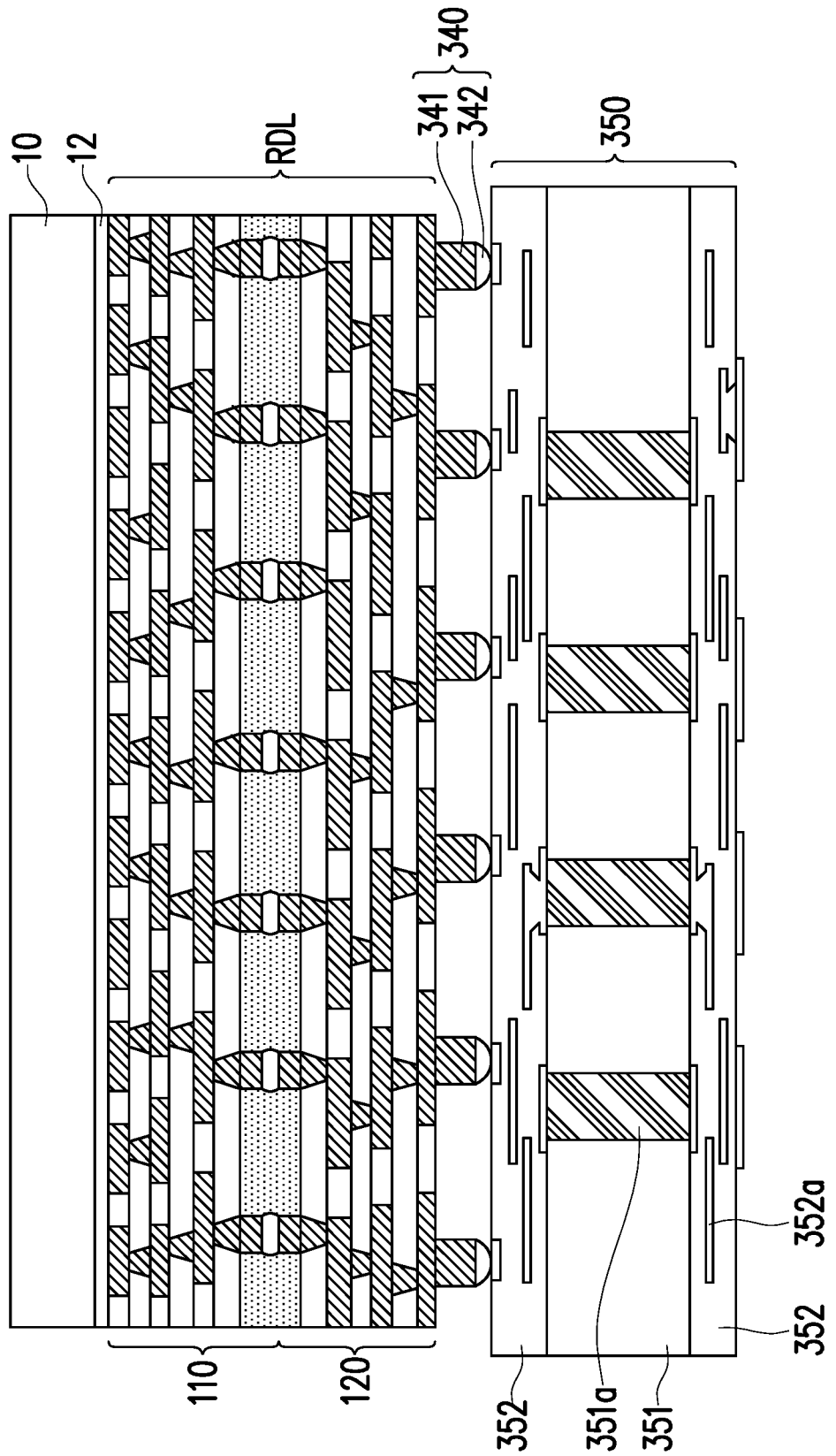

Referring to FIG. 3B, the multilayer redistribution structure RDL is bonded to a substrate 350 through the fifth conductive connectors 340. In some embodiments, a reflow process may be performed on the conductive caps 342 of the fifth conductive connectors 340 to electrically couple the multilayer redistribution structure RDL to the substrate 350, but the invention is not limited thereto. In the embodiment, the substrate 350 may be a ceramic substrate, a laminated organic substrate, a package substrate, an integrated substrate, etc.

In some embodiments, the substrate 350 includes a core layer 351, a build-up structures 352, and multiple through holes 351a. The build-up structures 352 are respectively formed on two sides of the core layer 351, and the through holes 351a penetrate through the core layer 351 to electrically connect the build-up structures 352 on both sides. The build-up structure 352 includes a conductive pattern 352a embedded in a dielectric layer, but the invention is not limited thereto, in an embodiment that is not shown, the substrate 350 may also not have the core layer 351.

Figure 3C:
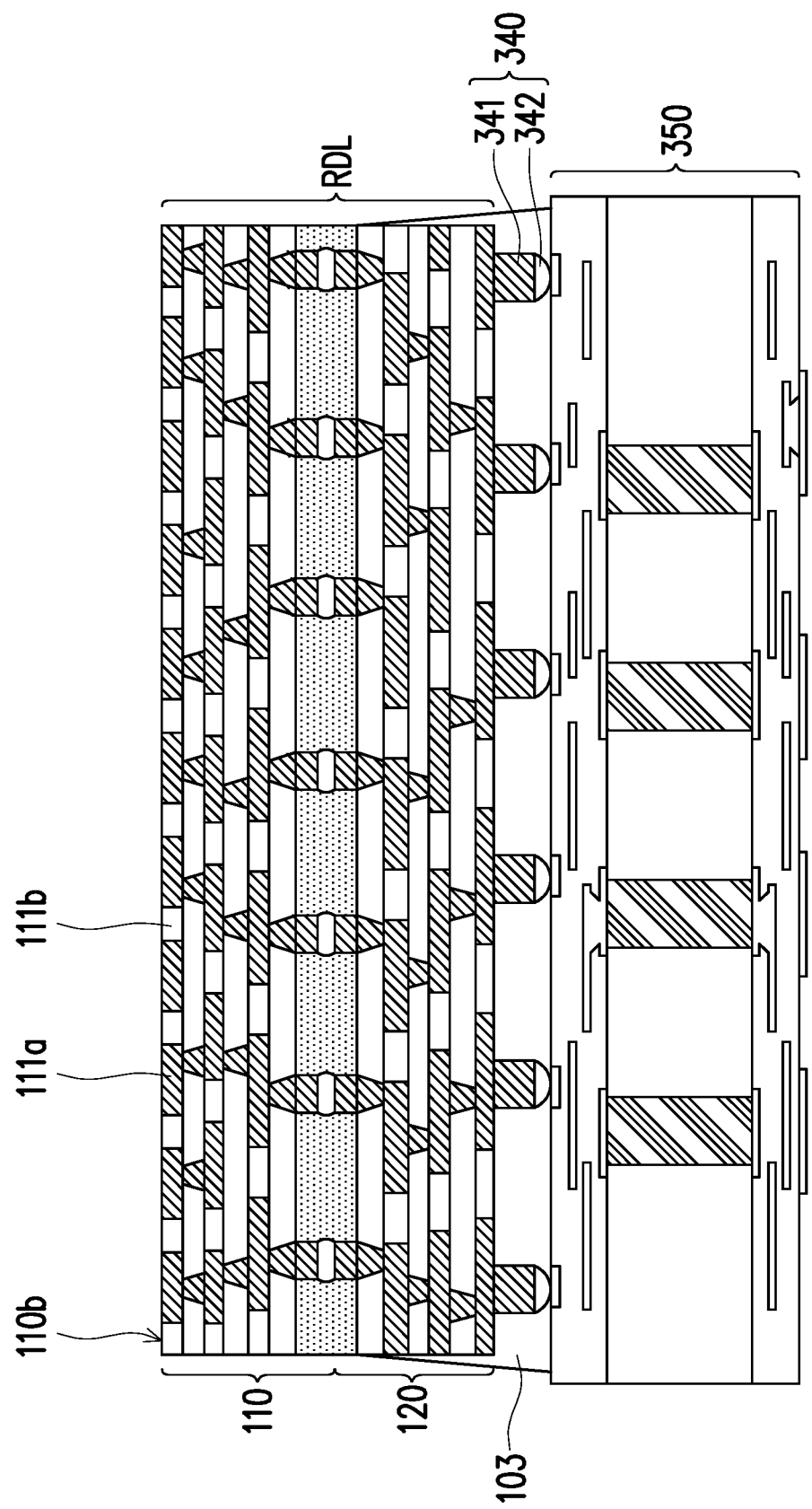

Referring to FIG. 3C, the first temporary carrier board 10 and the first release layer 12 are removed to expose the first conductive pattern 111a and the first dielectric layer 111b (which may be regarded as a chip end of the multilayer redistribution structure RDL) on the bottom surface 110b of the first group of circuit structure 110. In addition, a gap between the multilayer redistribution structure RDL and the substrate 350 in FIG. 3C may be selectively filled with a base adhesive 103.

Figure 3D:
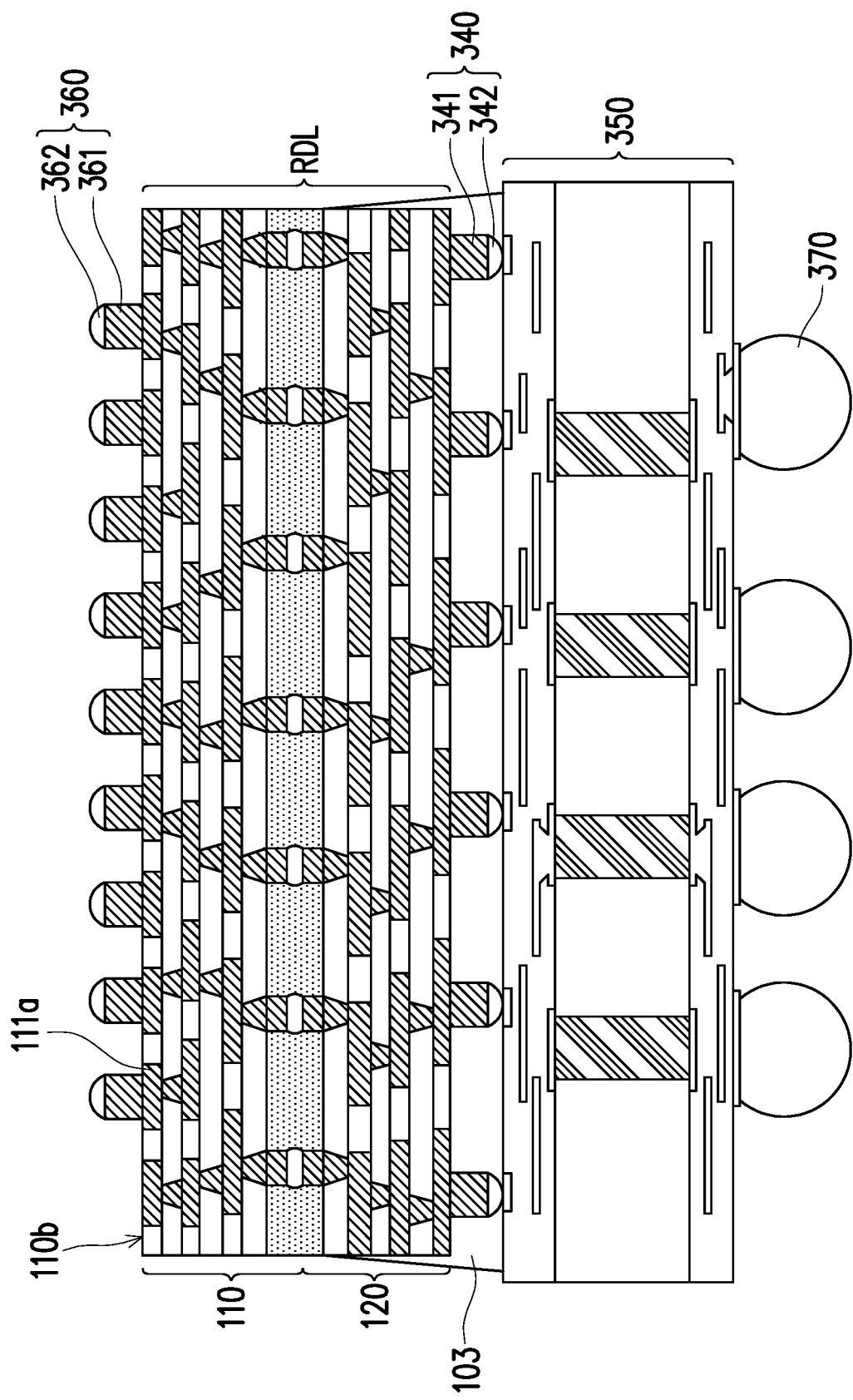

Referring to FIG. 3D, multiple chip connectors 360 are formed on the first conductive pattern 111a on the bottom surface 110b of the first group of circuit structure 110. Each of the chip connectors 360 includes a conductive pillar 361 and a conductive cap 362 formed thereon. In the embodiment, the conductive pillar 361 may be made of copper, and the conductive cap 362 may be made of solder, but the invention is not limited thereto, and the conductive pillar 361 and the conductive cap 362 may also be made of other suitable materials. In addition, multiple external terminals 370 may be formed on the substrate 350. The multilayer redistribution structure RDL is electrically connected to the external terminals 260 through the substrate 350. In the embodiment, a distribution density of the chip connectors 360 may be greater than a distribution density of the fifth conductive connectors 340.

Figure 3E:
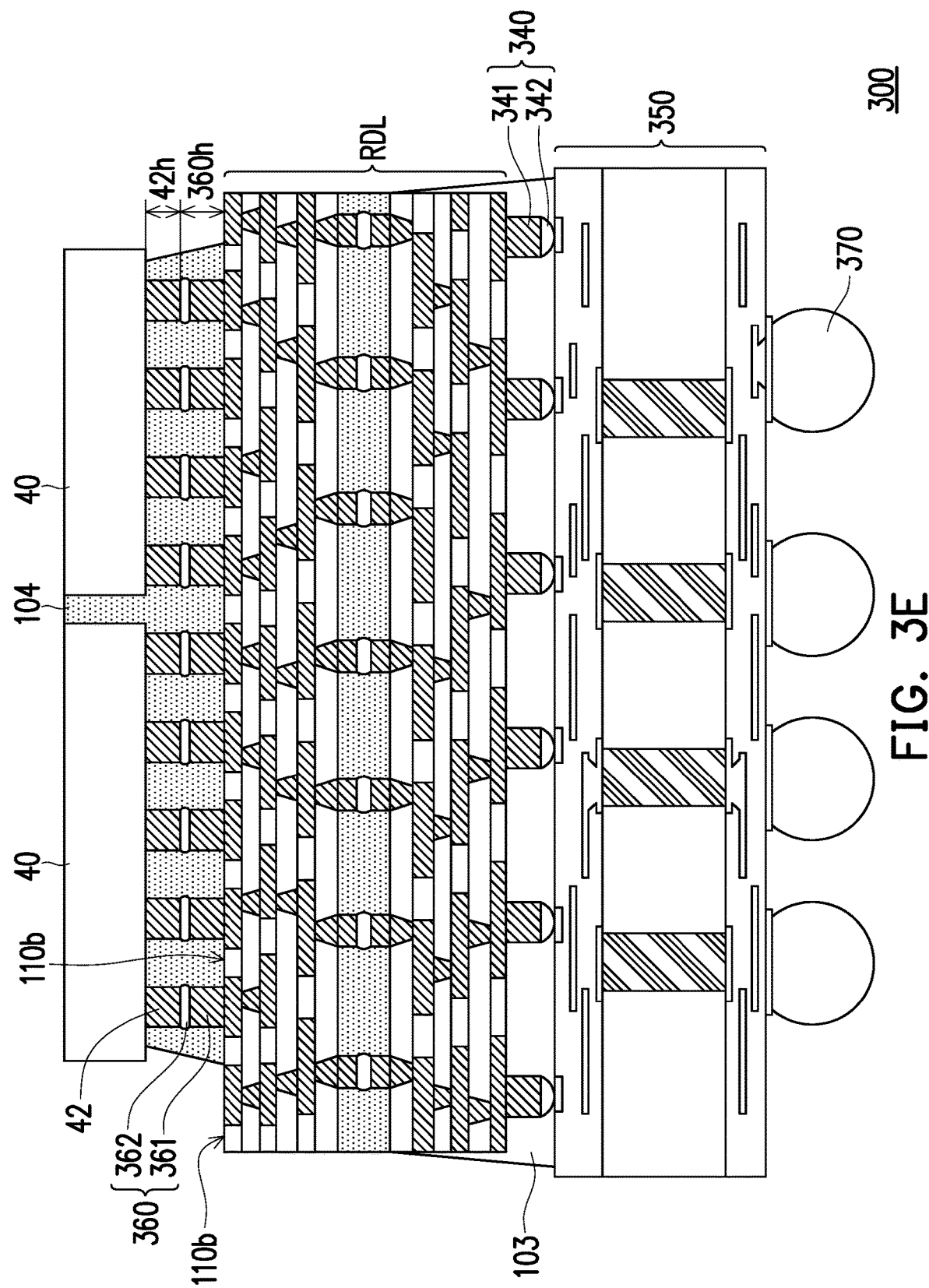

Referring to FIG. 3E, a semiconductor chip 40 may be connected to the bottom surface 110b of the first group of circuit structure 110 through, for example, flip-chip bonding. For example, conductive bumps 42 of the semiconductor chip 40 may be bonded to the conductive caps 362 of the chip connectors 360. In other words, the conductive bumps 42 of the semiconductor chip 40 may be in direct contact with the conductive caps 362 of the chip connectors 360 to form a heterogeneous integration module or system.

In some embodiments, the semiconductor chip 40 is, for example, a logic chip, a memory chip, a three-dimensional integrated circuit (3DIC) chip (such as a high bandwidth memory chip) and/or the like. The 3DIC chip includes multiple layers stacked on each other, and through silicon vias (TSVs) are formed to provide vertical electrical connections between the layers, but the invention is not limited thereto.

In some embodiments, a height 42h of the conductive bump 42 may be greater than a height 360h of the corresponding chip connector 360, but the invention is not limited thereto, and the height 42h of the conductive bump 42 and the height 360h of the chip connector 360 may be determined according to actual design requirements.

In some embodiments, the base adhesive 104 may be formed on the bottom surface 110b of the first group of circuit structure 110 to be filled into the gap between the bottom surface 110b and the semiconductor chip 40, thereby enhancing reliability of the flip-chip bonding. In some embodiments, more than one semiconductor chips 40 performing the same or different functions may be disposed on the first group of circuit structure 110. In this case, the semiconductor chips 40 may be electrically connected to the first group of circuit structure 110 and electrically connected to each other through the first group of circuit structure 110. The number of the semiconductor chips 40 disposed on the first group of circuit structure 110 does not constitute a limitation of the invention. The semiconductor substrate structure 300 of the embodiment is substantially completed through the above fabrication.

In some embodiments, the external terminals 370 may be solder balls and may be formed through a ball-mounting process to be placed on the second conductive pattern 121a of the second group of circuit structure 120, and a soldering process and a reflow process may be selectively performed to enhance adhesion between the external terminals 370 and the second conductive pattern 121a, but the invention is not limited thereto.

In an embodiment that is not shown, the semiconductor substrate structure 200 may further be disposed on a circuit carrier (for example, a printed circuit board (PCBs), a system board, a motherboard, etc.), a molding compound, and/or other components to form an electronic device. For example, the external terminals 370 are disposed on a circuit carrier, and the semiconductor chip 40 is electrically connected to the circuit carrier or other components in the circuit carrier through the multilayer redistribution structure RDL, but the invention is not limited thereto.

In some embodiments, the semiconductor substrate structure 300 is a wafer level semiconductor packaging structure, but the invention is not limited thereto.

Figure 4:
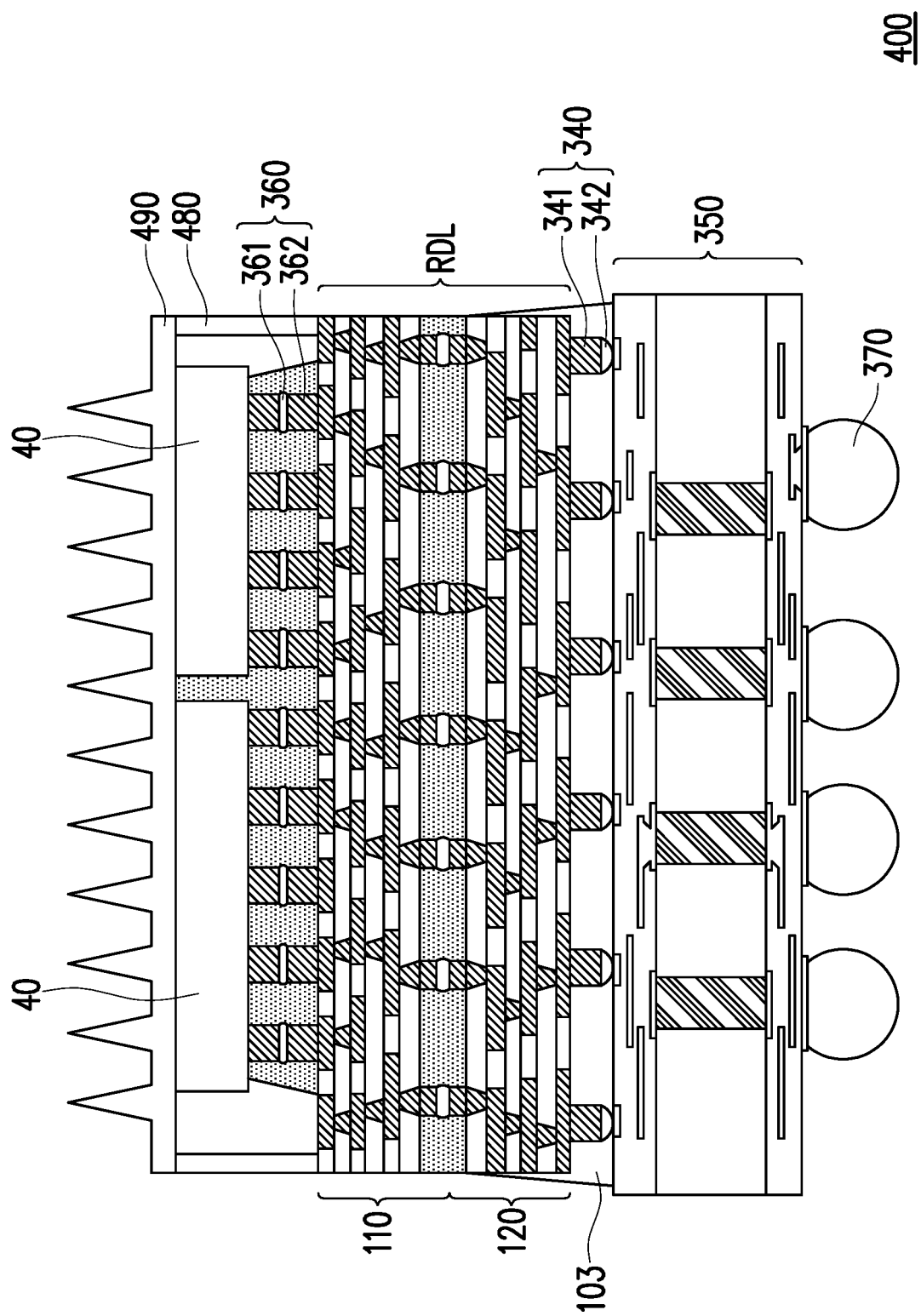
FIG. 4 is a partial schematic cross-sectional view of a semiconductor structure according to still further embodiments of the invention.

FIG. 4 is a partial schematic cross-sectional view of a semiconductor structure according to still further embodiments of the invention. Referring to FIG. 4, a difference between a semiconductor substrate structure 400 of the embodiment and the semiconductor substrate structure 300 of FIG. 3E is that the semiconductor substrate structure 400 of the embodiment further includes a module frame 480 and a heat dissipation element 490. The module frame 480 is disposed on the bottom surface 110b of the first group of circuit structure 110 and surrounds the semiconductor chip 40, and the heat dissipation element 490 is disposed on the semiconductor chip 40 and, together with the module frame 480, forms a space for framing the semiconductor chip 40, but the invention is not limited thereto. In the embodiment, the module frame 480 and the heat dissipation element 490 may be selected and assembled according to actual design requirements, which is not limited by the invention.

FIG. 6A to FIG. 6G are partial schematic cross-sectional views of a manufacturing method of a semiconductor structure according to some embodiments of the invention. FIG. 6H to FIG. 6J are partial schematic cross-sectional views of partial manufacturing method of a semiconductor structure according to some embodiments of the invention. It should be noted that in FIG. 6A to FIG. 6J, multiple first wiring layers of the first group of circuit structure and multiple second wiring layers of the second group of circuit structure are not illustrated specifically and a size of the components are adjusted for clarity description, the same or similar reference numerals or terms denote the same or similar elements, and the repeated descriptions will not be repeated in the following paragraphs.

Figure 6A:
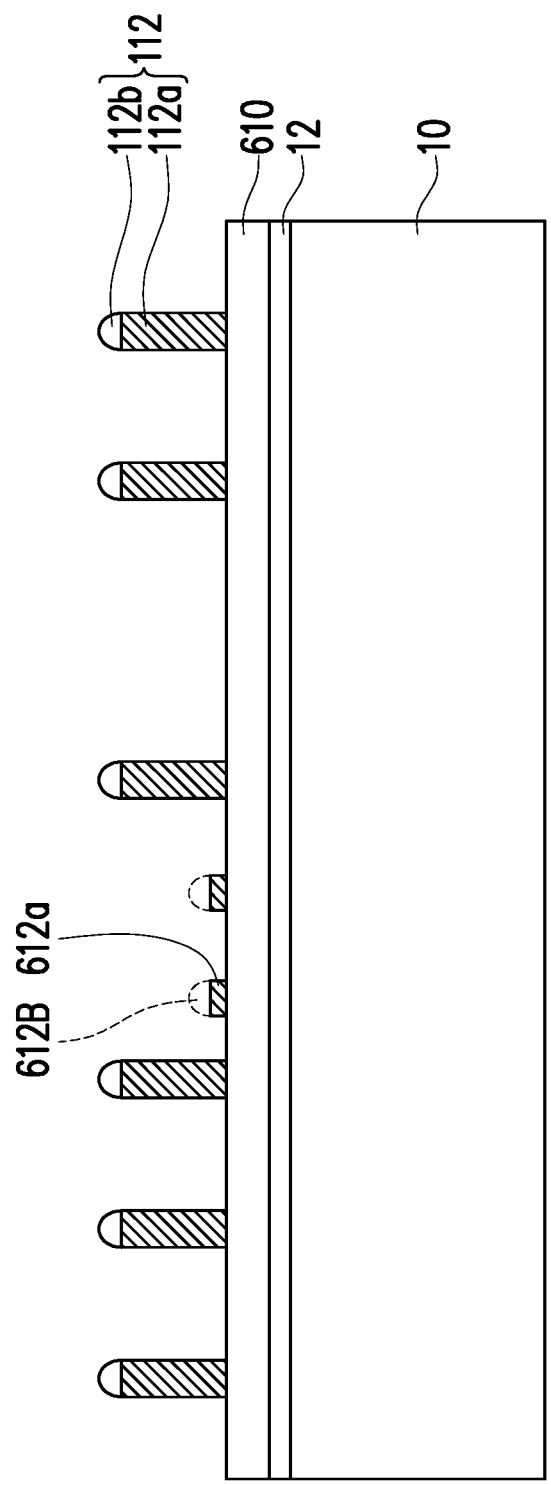

Referring to FIG. 6A, a first group of circuit structure 610 is provided and the first group of circuit structure 610 is similar to the first group of circuit structure 110 in FIG. 1A, a difference is that the first group of circuit structure 610 of this embodiment further includes a plurality of pads 612a. Moreover, the pads 612a may be disposed between two adjacent first conductive connectors 112 for subsequent application. In here, other pads are optionally located below the conductive pillar 112a (not shown).

In the embodiment, in this step, a plurality of solders 612B are disposed on the pads 612a, respectively, but the disclosure is not limited thereto, in another embodiment, the solders may be omitted, for example, only the pads 612a (Cu/Ni/Au) are disposed on the first group of circuit structure 610, therefore, the solders 612B are illustrated in the dash line in FIG. 6A.

Figure 6B:
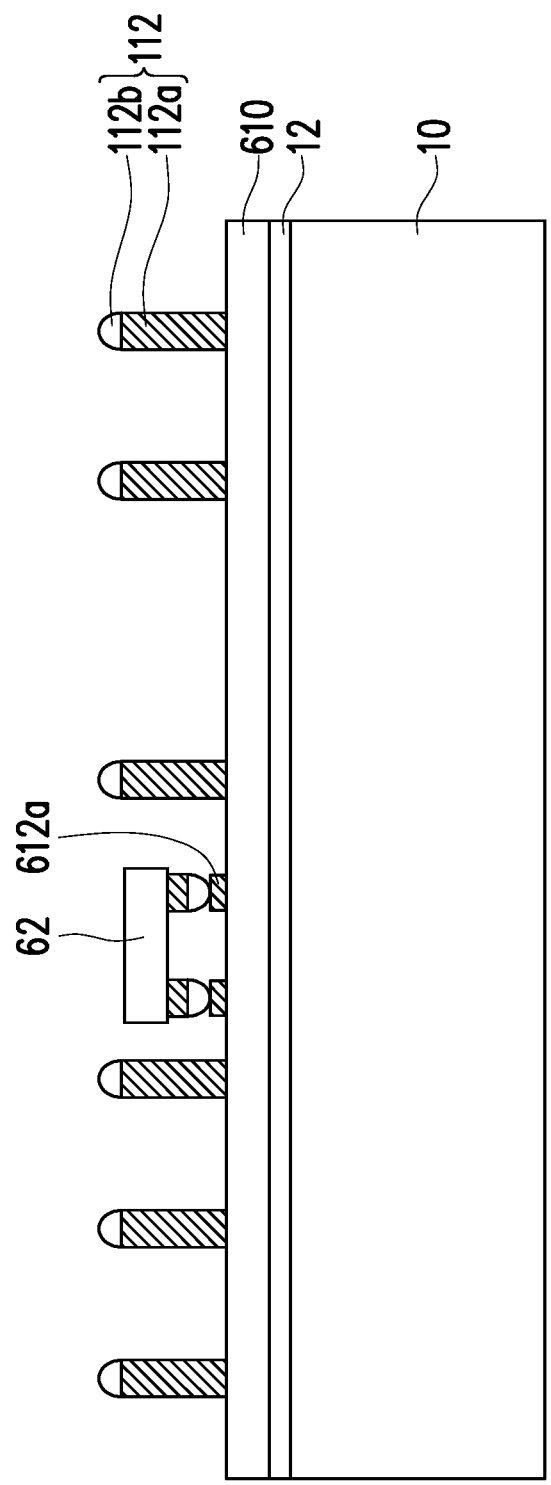

Referring to FIG. 6B, a first device 62 is disposed on the pads 612a, such that the first device 62 may be disposed the first group of circuit structure 610 and electrically connected to portion of the first conductive connectors 112, but the disclosure is not limited thereto, the first device 62 can use other manner to disposed on the first group of circuit structure 610. It should be noted that if the solders 612b are omitted in FIG. 6A, there may be a plurality of solders are formed on the first device 62 for bonding.

In the embodiment, the first device 62 includes an active device, a passive device, or combinations thereof, for example, the active device may be a die or the like, and the passive device may be a capacitor, an inductor, or the like, the disclosure is not limited thereto.

Figure 6C:
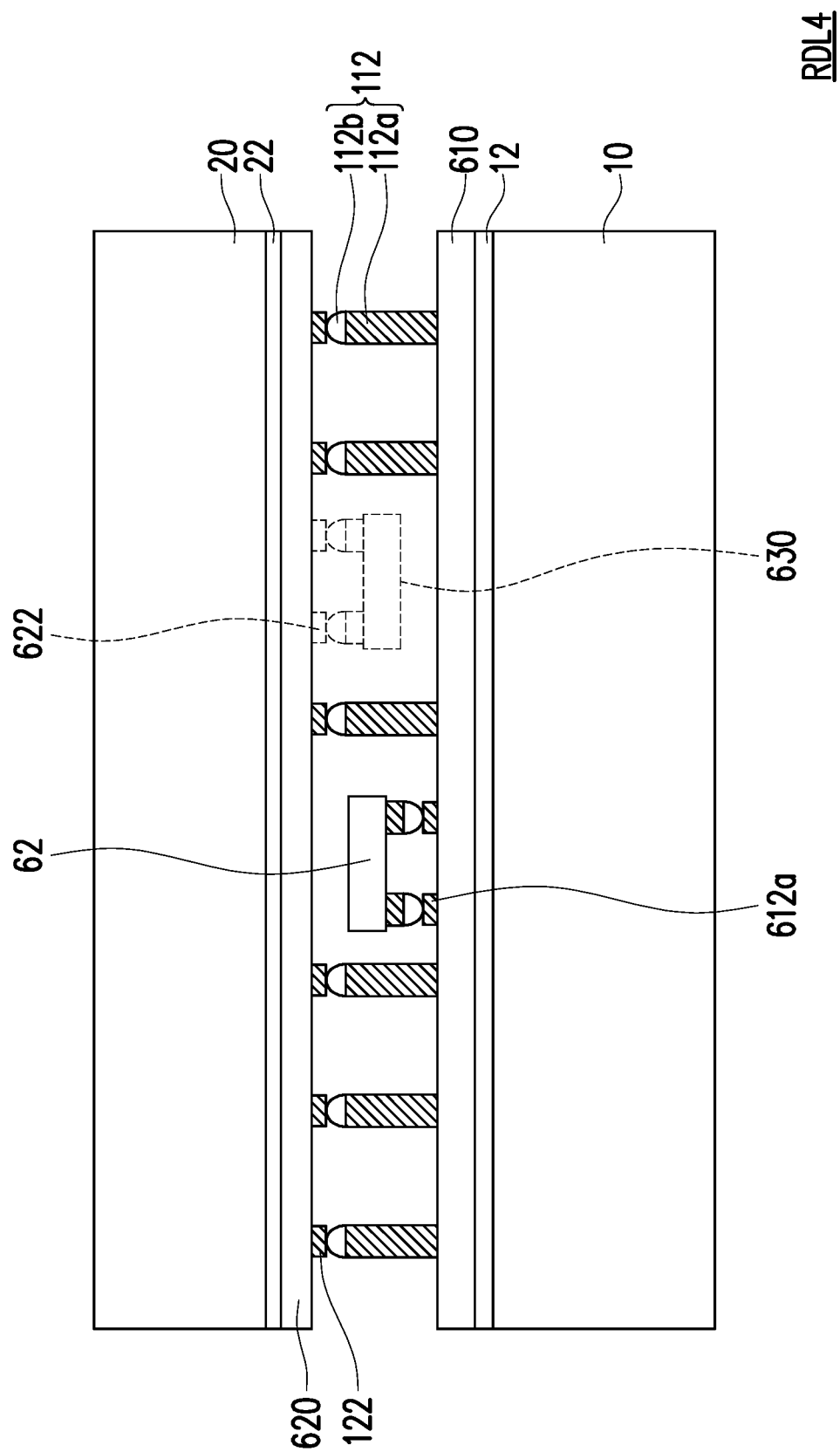

Referring to FIG. 6C, a second group of circuit structure 620 with the second temporary carrier board 20 and the second release layer 22 is provided, and bond the first group of circuit structure 610 and the second group of circuit structure 620 to form a multilayer redistribution structure RDL4, so that the first conductive connectors 112 are bonded to the second conductive connectors 122, the first device 62 is between the first group of circuit structure 610 and the second group of circuit structure 620, wherein the second group of circuit structure 620 is similar to the second group of circuit structure 120 in FIG. 1B, a difference is as follow.

In the embodiments, the second group of circuit structure 620 includes a plurality of pads 622 and a second device 630 disposed on the pads 622, such that the second device 630 may be disposed on the second group of circuit structure 620 and electrically connected to portion of the second conductive connectors 122, but the disclosure is not limited thereto, in another embodiment, the pads and the second device may be omitted, therefore, the pads and the second device are illustrated in the dash line in FIG. 6C.

In some embodiments, the first device 62 and the second device 630 may be disposed on different positions, for example, the first device 62 may be disposed between two adjacent second conductive connectors 122, or the second device 630 may be disposed between two adjacent first conductive connectors 112, or the first device 62 and the second device 630 may be disposed on the first group of circuit structure 610 or the second group of circuit structure 620 together. Moreover, either the first device 62 or the second device 630 may be omitted.

In the embodiment, the second device 630 includes an active device, a passive device, or combinations thereof, for example, the active device may be a die or the like, and the passive device may be a capacitor, an inductor, or the like, the disclosure is not limited thereto.

Referring to FIG. 6D, the multilayer redistribution structure RDL4 may be optionally have the underfill 101 disposed between the first group of circuit structure 610 and the second group of circuit structure 620, and the underfill 101 may be filled into a gap between the first conductive connectors 112 and the second conductive connectors 122, so that the underfill 101 may surround the first conductive connectors 112 and the second conductive connectors 122 to further improve bonding reliability, but the disclosure is not limited thereto.

In the embodiment, the first device 62 and the second device 630 are surrounded by the underfill 101, but the disclosure is not limited thereto.

Figure 6E:
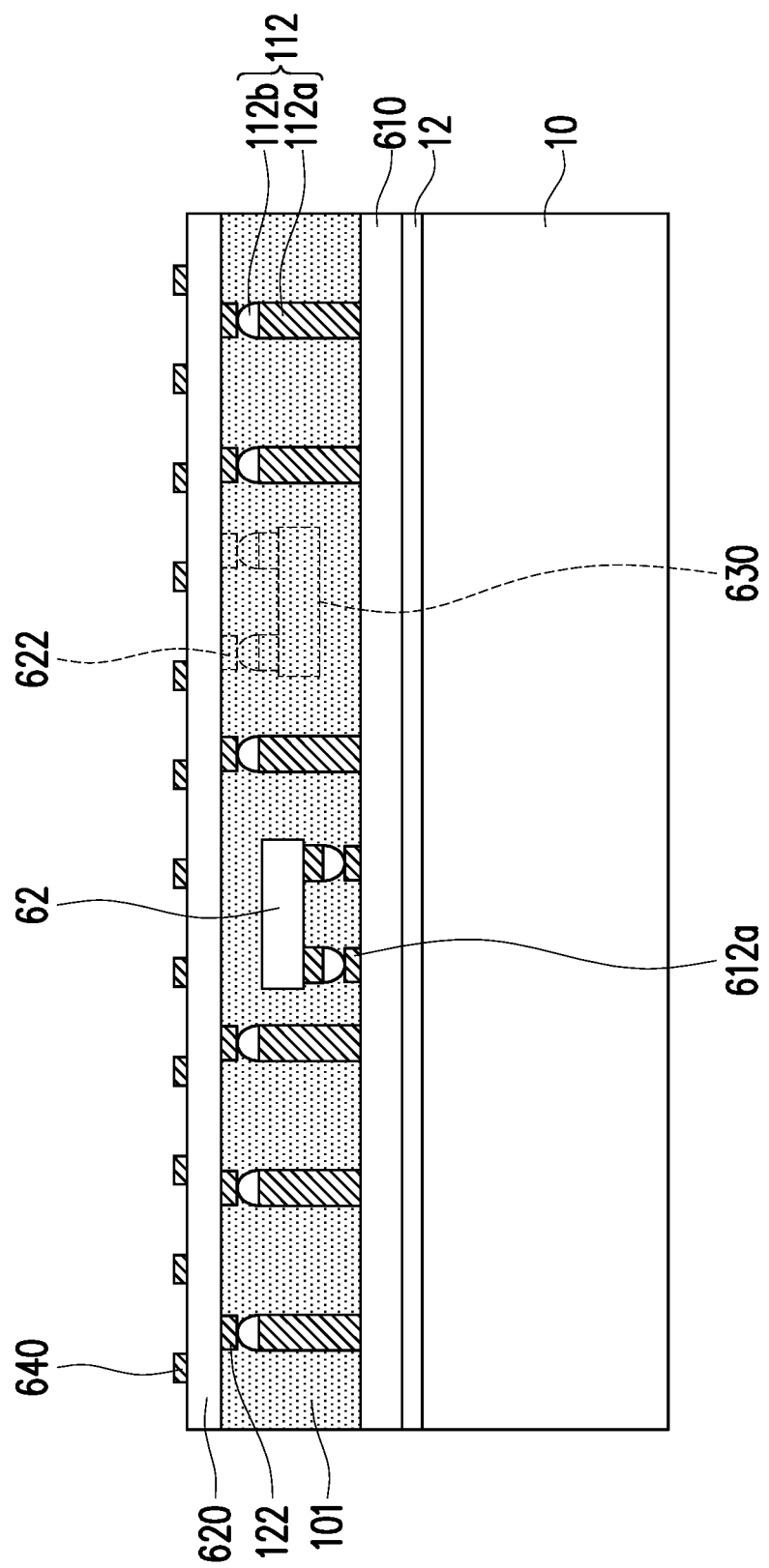

Referring to FIG. 6E, the second temporary carrier board 20 may be removed by the second release layer 22, and a plurality of pads 640 are form on the second group of circuit structure 620, for example, materials of the pads 640 may be Cu/Ni/Au.

Figure 6F:
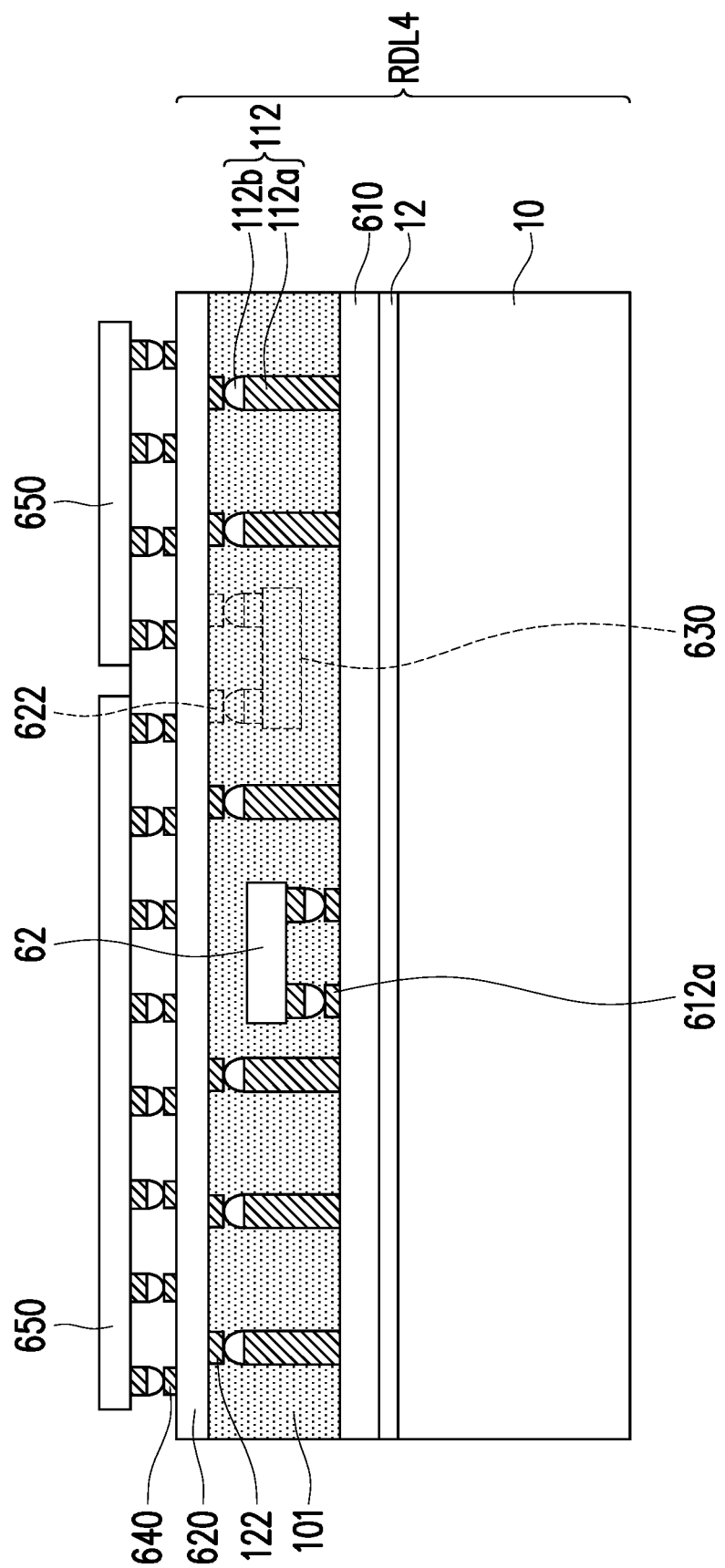

Referring to FIG. 6F, at least one chip 650 is disposed on the multilayer redistribution structure RDL4, wherein FIG. 6F schematically illustrates two chips 650. For example, the chip 650 may be connected to the second group of circuit structure 620 through, for example, flip-chip bonding.

Figure 6G:
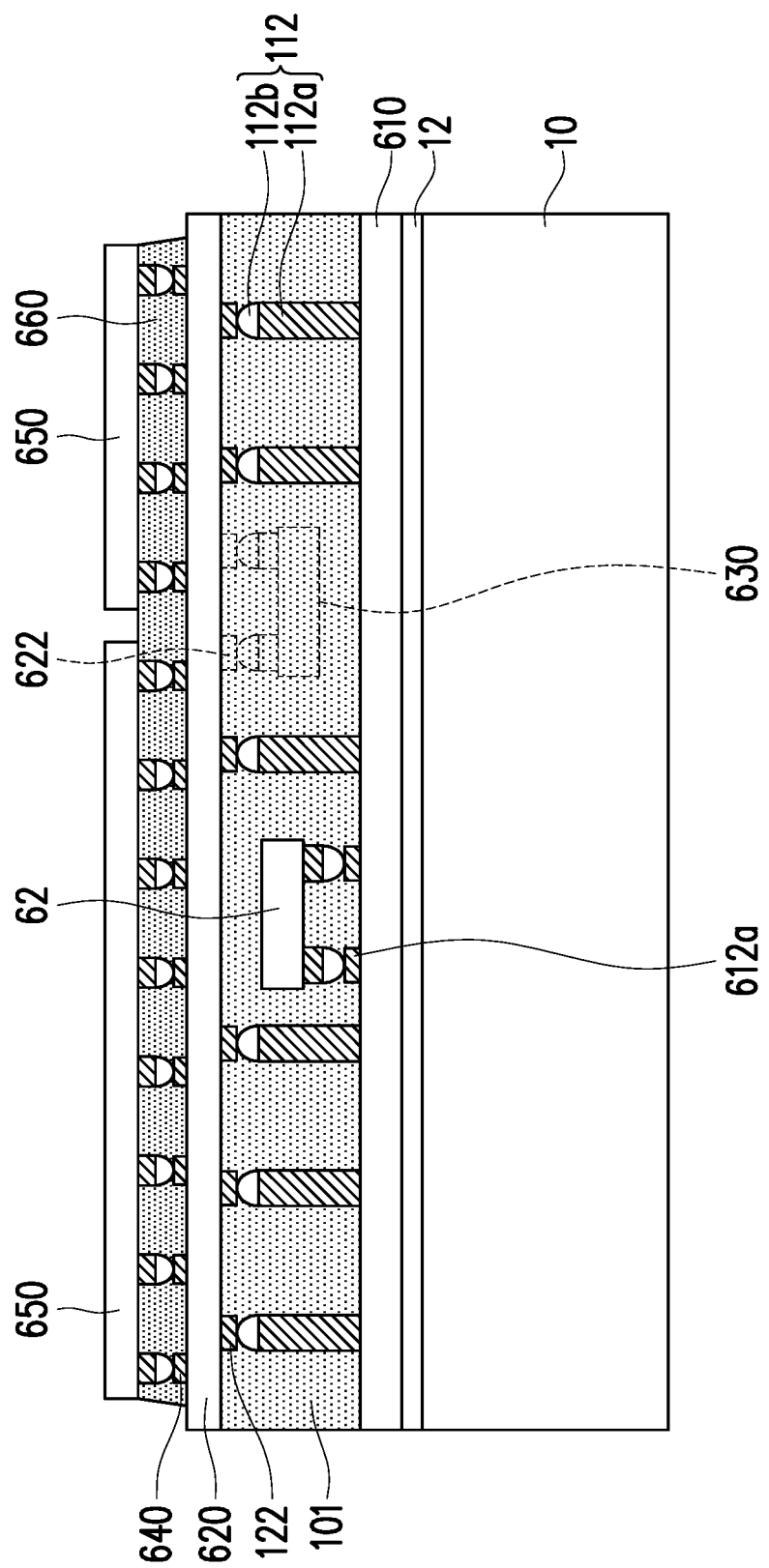
Figure 6H:
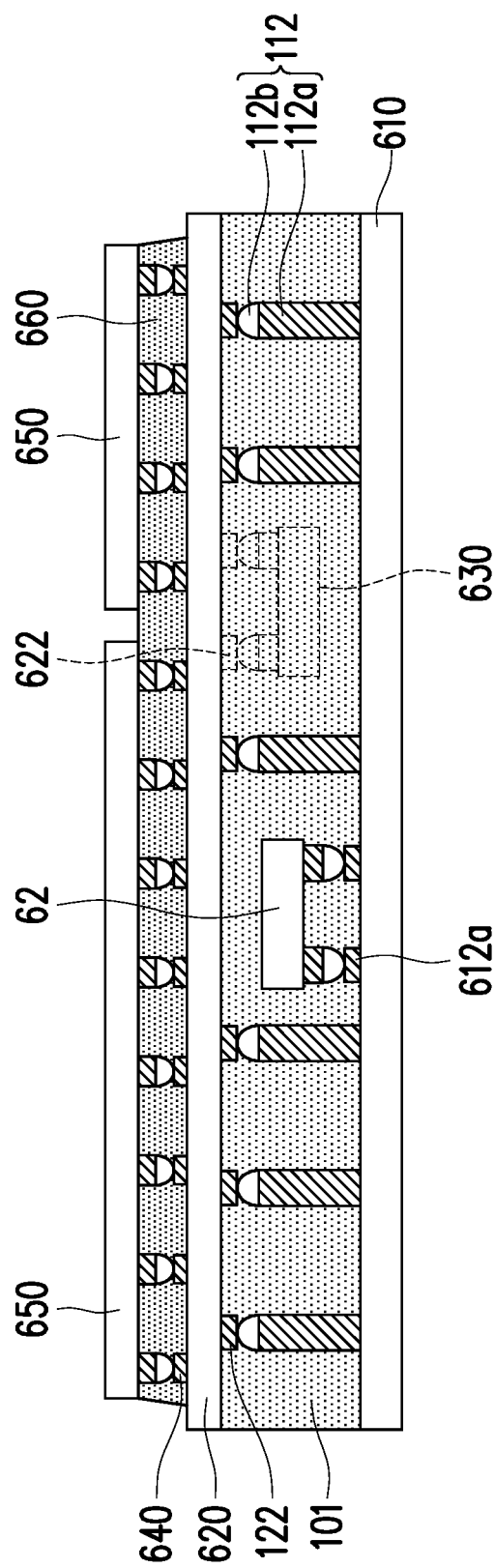
FIG. 6H to FIG. 6J are partial schematic cross-sectional views of partial manufacturing method of a semiconductor structure according to some embodiments of the invention.
Figure 6I:
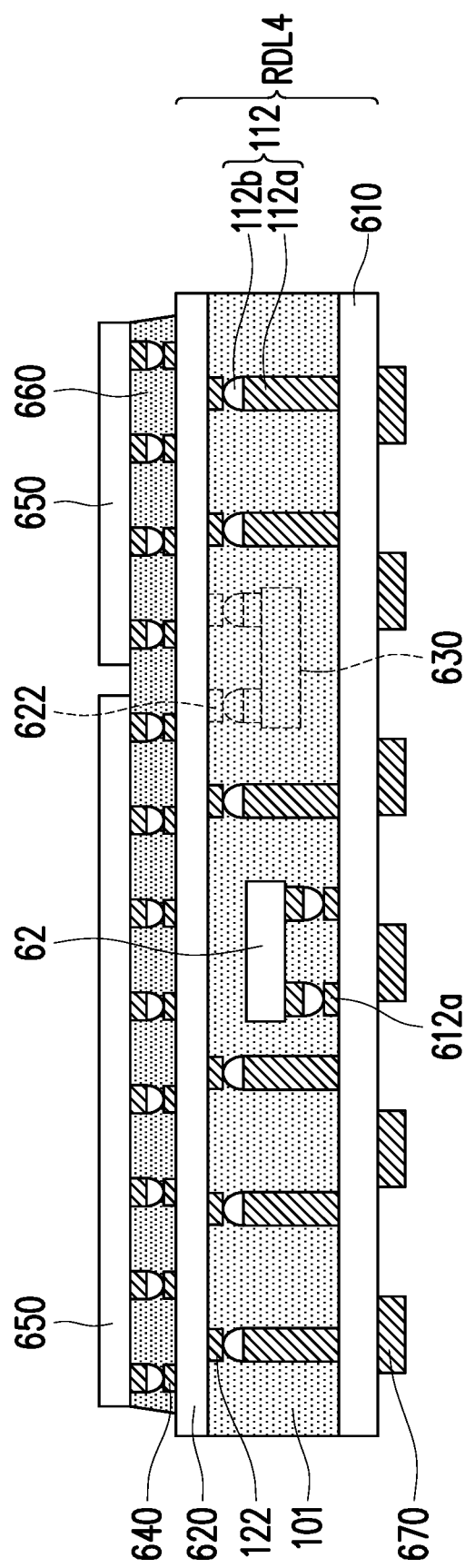
Figure 6J:
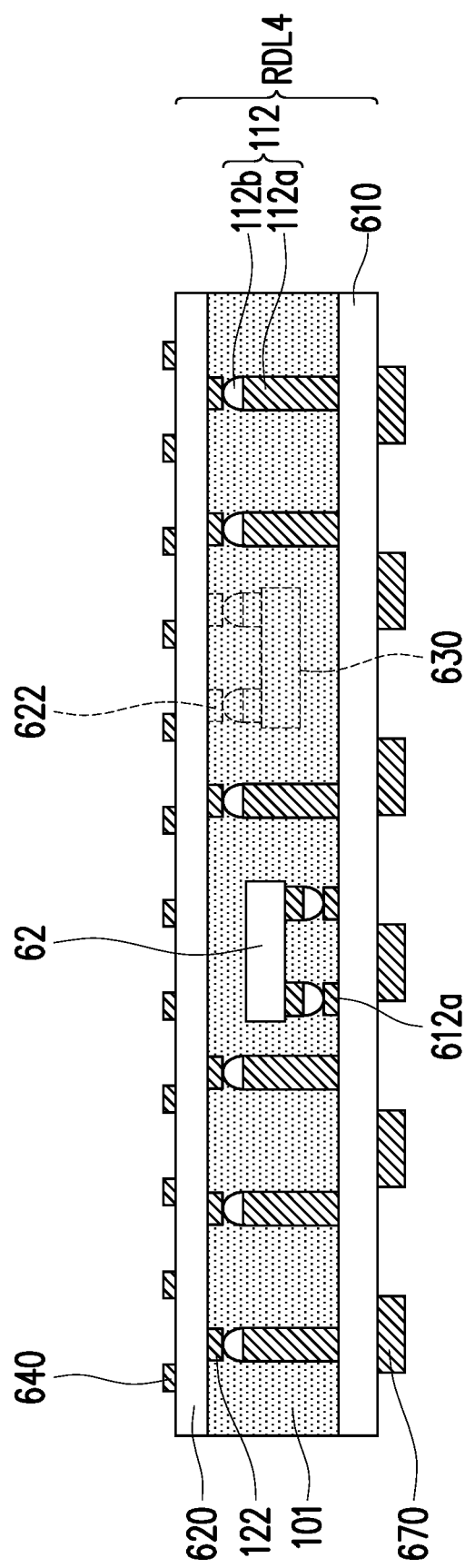

Referring to FIG. 6G, an underfill 660 is disposed between the second group of circuit structure 620 and the chip 650, and the underfill 660 may be filled into a gap between the second group of circuit structure 620 and the chip 650, so that the bonding reliability is further improved, but the disclosure is not limited thereto.

Referring to FIG. 6H and FIG. 6I, the first temporary carrier board 10 may be removed by the first release layer 12 and then a plurality of external pads 670 are formed on the multilayer redistribution structure RDL4, therefore, in this embodiment, a step of the chip 650 disposed on the multilayer redistribution structure RDL4 is before a step of the external pads 670 formed on the multilayer redistribution structure RDL4, but the disclosure is not limited thereto. Moreover, the external pads 670 may be bonded to a PCB in subsequently process.

Referring to FIG. 6J, in another embodiment, between a step of the pads 640 formed and the step of the chip 650 disposed on the multilayer redistribution structure RDL4, the step of the external pads 670 formed on the multilayer redistribution structure RDL4 is performed, therefore, the step of the external pads 670 formed on the multilayer redistribution structure RDL4 is before the step of the chip 650 disposed on the multilayer redistribution structure RDL4.

Figure 7A:
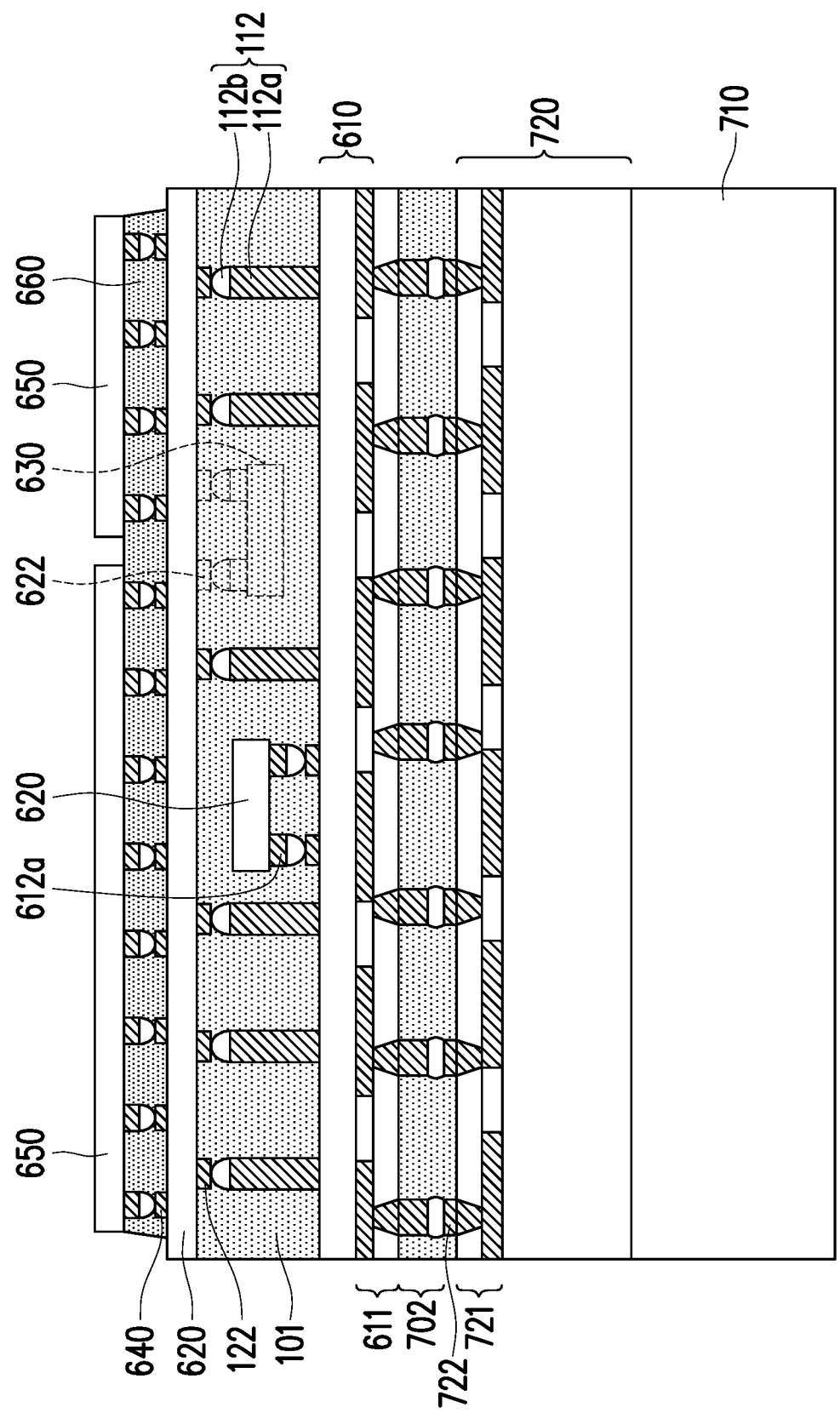
FIG. 7A to FIG. 7B are partial schematic cross-sectional views of a manufacturing method of a semiconductor structure according to some embodiments of the invention.
Figure 7B:
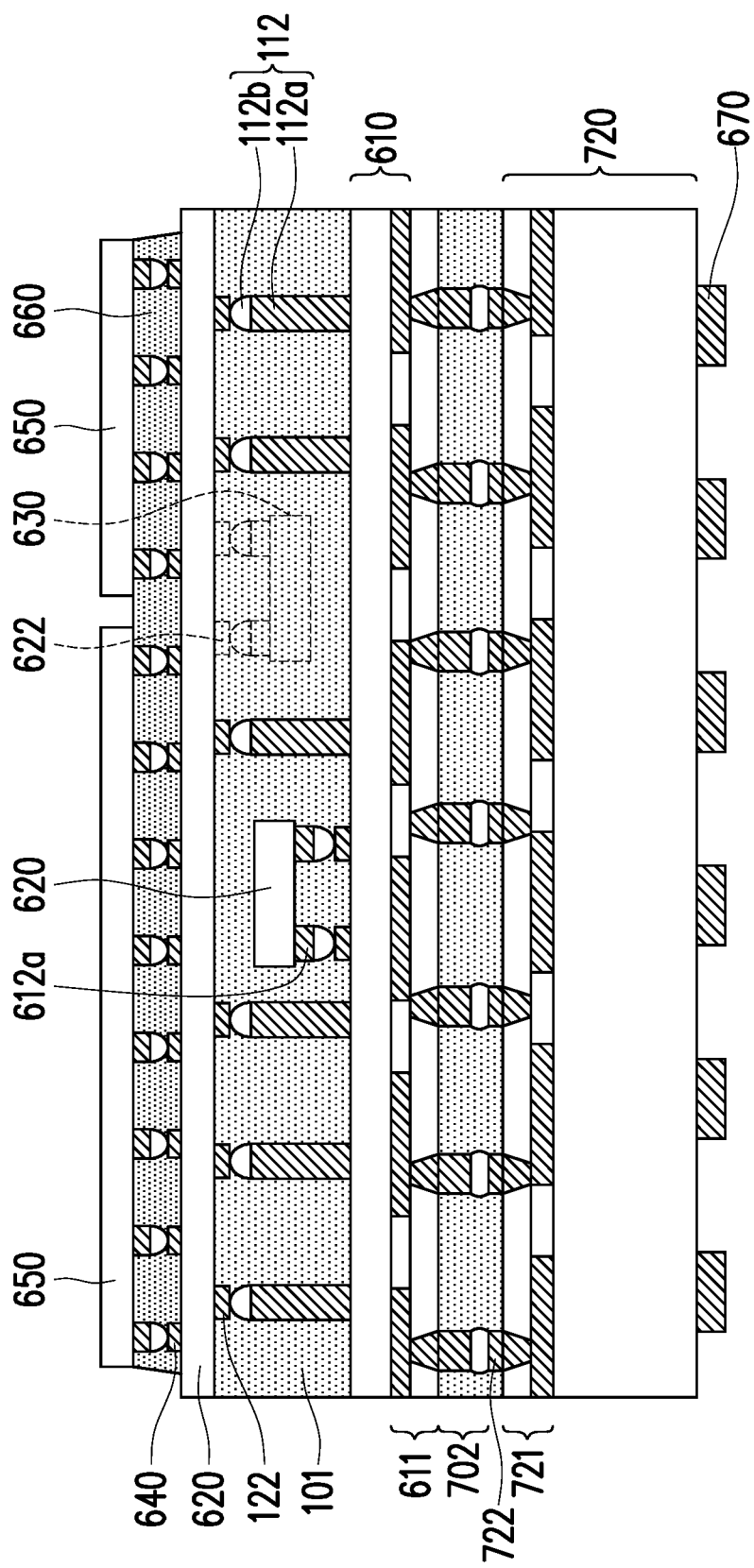
Figure 7C:
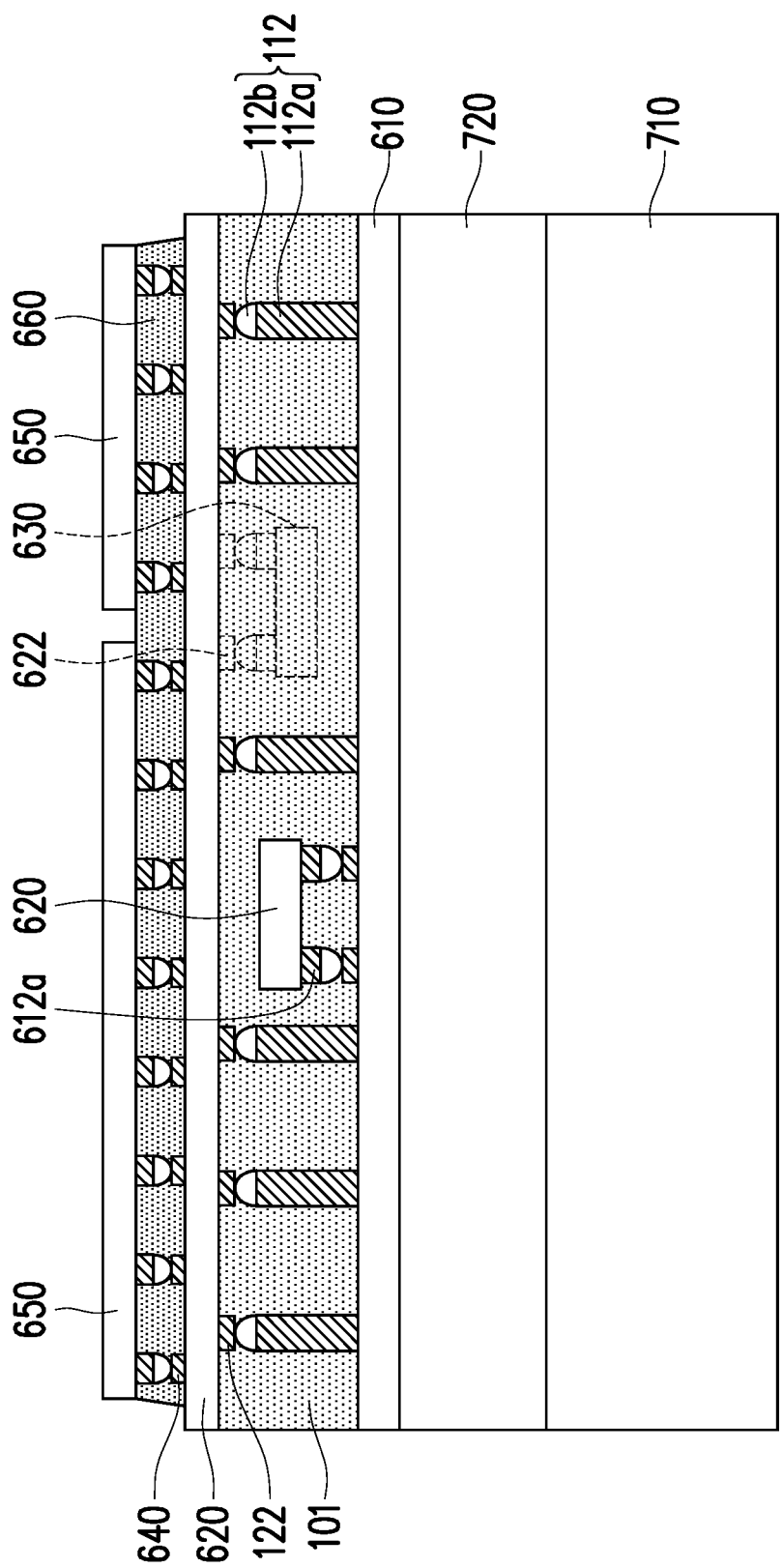
FIG. 7C to FIG. 7D are partial schematic cross-sectional views of a manufacturing method of a semiconductor structure according to some embodiments of the invention.
Figure 7D:
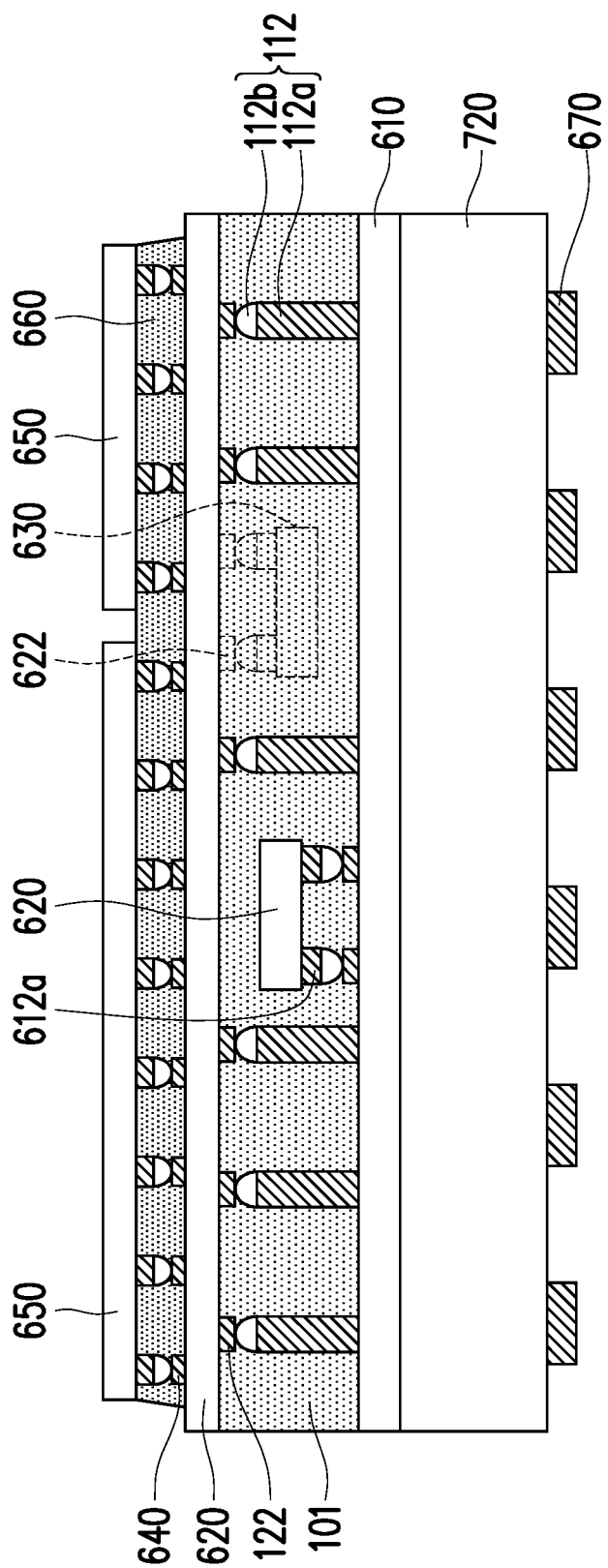

FIG. 7A to FIG. 7B are partial schematic cross-sectional views of a manufacturing method of a semiconductor structure according to some embodiments of the invention. FIG. 7C to FIG. 7D are partial schematic cross-sectional views of a manufacturing method of a semiconductor structure according to some embodiments of the invention.

Referring to FIG. 7A and FIG. 7B, the multilayer redistribution structure further includes a third group of circuit structure 720 (substrate with ABF material), the chip 650 and the third group of circuit structure 720 are disposed on opposite sides of the semiconductor structure. For example, continued from FIG. 6D, the first temporary carrier board 10 may be removed by the first release layer 12, and the third group of circuit structure 720 with another temporary carrier board 710 (a release layer is omitted) is bonded to the first group of circuit structure 610. Next, the temporary carrier board 710 is removed, and a plurality of external pads 670 are formed on the multilayer redistribution structure, as shown in FIG. 7B.

In the embodiment, the third group of circuit structure 720 is separated from adjacent group of circuit structure (such as the first group of circuit structure 610), for example, the third group of circuit structure 720 is bonded to the first group of circuit structure 610 through a plurality of conductive connectors 702. For example, the conductive connectors 702 is disposed between a top circuit layer 611 of the first group of circuit structure 610 and a top circuit layer 721 of the first group of circuit structure 610, and the conductive connectors 702 may be direct in contact with a plurality of pads 722 formed on the top circuit layer 721, but the disclosure is not limited thereto.

Referring to FIG. 7C and FIG. 7D, in another embodiment, a difference between FIG. 7A to FIG. 7B and FIG. 7C to FIG. 7D, the third group of circuit structure 720 is direct contact with adjacent group of circuit structure (such as the first group of circuit structure 610), for example, the third group of circuit structure 720 is bonded to the first group of circuit structure 610 by a direct bonding process. In here, any suitable direct bonding process may be used.

In summary, multiple groups of circuit structures are separately fabricated on the temporary carrier boards, and then the multiple groups of circuit structures are directly assembled into a multilayer redistribution structure. In this way, compared with the multilayer redistribution structure fabricated continuously at one time, a degree of warpage may be effectively reduced, so that the semiconductor substrate structure may maintain better yield and electrical performance while having the multilayer redistribution structure.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A semiconductor substrate structure, comprising:
    a first group of circuit structure, comprising a plurality of first wiring layers and a plurality of first conductive connectors, wherein each of the first conductive connectors comprises a conductive cap;
    a second group of circuit structure, comprising a plurality of second wiring layers and a plurality of second conductive connectors, wherein the first group of circuit structure and the second group of circuit structure are electrically connected through bonding of the first conductive connectors and the second conductive connectors to form a multilayer redistribution structure, a number of the first wiring layers of the first group of circuit structure is the same as a number of the second wiring layers of the second group of circuit structure; and
    a first device, wherein:
        the first device is disposed on the first group of circuit structure and electrically connected to portion of the first conductive connectors; or
        the first device is disposed on the second group of circuit structure and electrically connected to portion of the second conductive connectors.

2. The semiconductor substrate structure according to claim 1, wherein the first device comprises an active device, a passive device, or combinations thereof.

3. The semiconductor substrate structure according to claim 1, wherein the first device is disposed on a plurality of pads of first group of circuit structure or a plurality of a pads of second group of circuit structure.

4. The semiconductor substrate structure according to claim 1, further comprising: an underfill disposed between the first group of circuit structure and the second group of circuit structure, wherein the first device is surrounded by the underfill.

5. The semiconductor substrate structure according to claim 1, further comprising: a second device disposed between two adjacent first conductive connectors or two adjacent second conductive connectors.

6. The semiconductor substrate structure according to claim 5, wherein the second device comprises an active device, a passive device, or combinations thereof.

7. The semiconductor substrate structure according to claim 5, wherein the second device is disposed on a plurality of pads of first group of circuit structure or a plurality of a pads of second group of circuit structure.

8. The semiconductor substrate structure according to claim 5, further comprising: an underfill disposed between the first group of circuit structure and the second group of circuit structure, wherein the first device and the second device are surrounded by the underfill.

9. The semiconductor substrate structure according to claim 5, wherein the first device is disposed on one of the first group of circuit structure and the second group of circuit structure, and the second device is disposed on another one of the first group of circuit structure and the second group of circuit structure.

10. A semiconductor structure, comprising:
    the semiconductor substrate structure according to claim 1; and
    at least one chip, disposed on the multilayer redistribution structure.

11. The semiconductor structure according to claim 10, further comprising: an underfill disposed between the at least one chip and the multilayer redistribution structure.

12. The semiconductor structure according to claim 10, further comprising: a plurality of external pads disposed on the multilayer redistribution structure.

13. The semiconductor structure according to claim 10, wherein the multilayer redistribution structure further comprises a third group of circuit structure, the at least one chip and the third group of circuit structure are disposed on opposite sides of the semiconductor structure.

14. The semiconductor structure according to claim 13, wherein the third group of circuit structure is separated from adjacent group of circuit structure.

15. The semiconductor structure according to claim 13, wherein the third group of circuit structure is direct contact with adjacent group of circuit structure.

16. A manufacturing method of a semiconductor structure, comprising:
    forming a first group of circuit structure on a first temporary carrier board, wherein the first group of circuit structure comprises a plurality of first wiring layers and a plurality of first conductive connectors, and each of the first conductive connectors comprises a conductive cap;
    forming a second group of circuit structure on a second temporary carrier board, wherein the second group of circuit structure comprises a plurality of second wiring layers and a plurality of second conductive connectors, a number of the first wiring layers of the first group of circuit structure is the same as a number of the second wiring layers of the second group of circuit structure;
    disposing a first device between two adjacent first conductive connectors or two adjacent second conductive connectors; and
    bonding the first conductive connectors of the first group of circuit structure are to the second conductive connectors of the second group of circuit structure to form electrical connection and form a multilayer redistribution structure.

17. The manufacturing method of a semiconductor structure according to claim 16, further comprising: disposing at least on chip on the multilayer redistribution structure, and then forming a plurality of external pads on the multilayer redistribution structure.

18. The manufacturing method of a semiconductor structure according to claim 16, further comprising: forming a plurality of external pads on the multilayer redistribution structure and then disposing at least on chip on the multilayer redistribution structure.

19. The manufacturing method of a semiconductor structure according to claim 16, further comprising: forming a third group of circuit structure to constitute the multilayer redistribution structure, wherein the third group of circuit structure is bonded to adjacent group of circuit structure through a plurality of third conductive connectors.

20. The manufacturing method of a semiconductor structure according to claim 16, further comprising: forming a third group of circuit structure to constitute the multilayer redistribution structure, wherein the third group of circuit structure is bonded to adjacent group of circuit structure by a direct bonding process.

* * * * *